US012787259B2

(12) United States Patent
Hsu

(10) Patent No.: US 12,787,259 B2
(45) Date of Patent: Nov. 3, 2026

(54) MEMORY DEVICE HAVING PLANARIZED FINS AND METHOD OF MANUFACTURING THE SAME

(71) Applicant: NANYA TECHNOLOGY CORPORATION, New Taipei City (TW)

(72) Inventor: Ping Hsu, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 365 days.

(21) Appl. No.: 18/739,627

(22) Filed: Jun. 11, 2024

(65) Prior Publication Data

US 2025/0359026 A1 Nov. 20, 2025

Related U.S. Application Data

(62) Division of application No. 18/665,837, filed on May 16, 2024.

(51) Int. Cl.
*H10B 12/00* (2023.01)

(52) U.S. Cl.
CPC ........... *H10B 12/34* (2023.02); *H10B 12/053* (2023.02)

(58) Field of Classification Search
CPC ...... H10B 12/053; H10B 12/30; H10B 12/34; H10B 12/36; H10B 12/488
See application file for complete search history.

(56) References Cited

U.S. PATENT DOCUMENTS

| | | | | |
|---|---|---|---|---|
| 2022/0077162 A1 | 3/2022 | Hong et al. | | |
| 2024/0049440 A1* | 2/2024 | Yoo | ...................... | H10B 12/033 |
| 2025/0311204 A1* | 10/2025 | Hong | .................. | H10B 12/053 |

FOREIGN PATENT DOCUMENTS

| | | |
|---|---|---|
| TW | 202211390 A | 3/2022 |
| TW | 202301553 A | 1/2023 |

OTHER PUBLICATIONS

Office Action and and the search report mailed on Jan. 16, 2026 related to Taiwanese Application No. 114126204.
Summary translation of Office Action and and the search report mailed on Jan. 16, 2026 related to Taiwanese Application No. 114126204.

(Continued)

*Primary Examiner* — Hoai V Pham
(74) *Attorney, Agent, or Firm* — Xuan Zhang

(57) ABSTRACT

The present disclosure provides a memory device and a method of manufacturing the memory device. The memory device includes a semiconductor substrate defined with an active area and including a plurality of fins protruding from the semiconductor substrate and disposed within the active area, wherein each of the plurality of fins has a first planar top surface; a first word line extending into the semiconductor substrate and between an adjacent pair of the plurality of fins, wherein the first word line includes an oxide layer conformal to surfaces of the adjacent pair of the plurality of fins, a first conductive member surrounded by the oxide layer, and a first nitride layer disposed over the first conductive member and surrounded by the oxide layer; and an isolation extending into the semiconductor substrate and surrounding the active area.

20 Claims, 31 Drawing Sheets

(56) References Cited

OTHER PUBLICATIONS

Office Action and and the search report mailed on Apr. 22, 2025 related to Taiwanese Application No. 113129939.
Summary translation of Office Action and and the search report mailed on Apr. 22, 2025 related to Taiwanese Application No. 113129939.

* cited by examiner

MEMORY DEVICE HAVING PLANARIZED FINS AND METHOD OF MANUFACTURING THE SAME

CROSS-REFERENCE TO RELATED APPLICATION

This application is a divisional application of U.S. Non-Provisional application Ser. No. 18/665,837 filed May 16, 2024, which is incorporated herein by reference in its entirety.

TECHNICAL FIELD

The present disclosure relates to a memory device and a manufacturing method thereof, and more particularly, to a memory device having planarized fins over a substrate and a manufacturing method of the memory device.

DISCUSSION OF THE BACKGROUND

Dynamic random-access memory (DRAM) is a type of semiconductor arrangement for storing bits of data in separate capacitors within an integrated circuit (IC). DRAMs are commonly formed as trench capacitor DRAM cells. An advanced method of fabricating a buried gate electrode involves building a gate electrode of a transistor and a word line in a trench in an active area (AA) comprising a shallow trench isolation (STI) structure.

Over the past few decades, as semiconductor fabrication technology has continuously improved, sizes of electronic devices have been correspondingly reduced. As a size of a cell transistor is reduced to a few nanometers in length, a size of a contact between the cell transistor and an active area can become an issue. A small contact area between the cell transistor and the active area may result in a significant drop in performance of the cell transistor. It is therefore desirable to develop improvements that address related manufacturing challenges.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a memory device. The memory device includes: a semiconductor substrate defined with an active area and including a plurality of fins protruding from the semiconductor substrate and disposed within the active area, wherein each of the plurality of fins has a first planar top surface; a first word line extending into the semiconductor substrate between adjacent pairs of the plurality of fins, wherein the first word line includes an oxide layer conformal to surfaces of the adjacent pair of the plurality of fins, a first conductive member surrounded by the oxide layer, and a first nitride layer disposed over the first conductive member and surrounded by the oxide layer, wherein the first nitride layer has a second planar top surface substantially coplanar with the first planar top surface of each of the plurality of fins; an isolation extending into the semiconductor substrate and surrounding the active area; a second word line disposed within the isolation and separated from the first word line by the plurality of fins; a conductive plug disposed over each of the plurality of fins and surrounded by a first insulating layer, wherein the first insulating layer is disposed over the semiconductor substrate and the isolation; a capacitor plug disposed in a second insulating layer and over the conductive plug, and protruding from the second insulating layer; and a landing pad disposed over the second insulating layer and over the capacitor plug.

Another aspect of the present disclosure provides a memory device. The memory device includes a semiconductor substrate defined with an active area; a plurality of fins disposed in the active area of the semiconductor substrate and protruding from the semiconductor substrate, wherein each of the plurality of fins has a first planar top surface; a word line structure, comprising a first word line extending into the semiconductor substrate between adjacent pairs of the plurality of fins, wherein the first word line includes an oxide layer conformal to surfaces of the adjacent pair of the plurality of fins, a first conductive member surrounded by the oxide layer, and a first nitride layer disposed over the first conductive member and surrounded by the oxide layer, wherein the first nitride layer has a second planar top surface substantially coplanar with the first planar top surface of each of the plurality of fins; an isolation extending into the semiconductor substrate and surrounding the active area; a second word line disposed within the isolation and separated from the first word line by the plurality of fins; a conductive plug disposed over each of the plurality of fins and surrounded by a first insulating layer, wherein the first insulating layer is disposed over the semiconductor substrate and the isolation; a capacitor plug disposed in a second insulating layer and over the conductive plug, and protruding from the second insulating layer; a landing pad disposed over the second insulating layer and over the capacitor plug; a patterned mask disposed over the second insulating layer and surrounding the landing pad; and a metal plug disposed on the landing pad.

Another aspect of the present disclosure provides a method for manufacturing a memory device. The method includes providing a first semiconductor structure, wherein the first semiconductor structure comprises a semiconductor substrate defined with a plurality of active areas; an isolation surrounding each of the plurality of active areas; a plurality of first recesses and a plurality of second recesses in the semiconductor substrate; a plurality of fins protruding from the semiconductor substrate, wherein each of the fins has a planar surface; a first dielectric layer conformal to each of the plurality of first recesses and surrounding the plurality of fins, wherein each of the plurality of fins has a first top surface after formation of the first dielectric layer; a first conductive member within each of the plurality of first recesses and surrounded by the first dielectric layer; a second dielectric layer over the first conductive member and surrounded by the first dielectric layer; and a conductive plug disposed over each of the plurality of fins and surrounded by a first insulating layer, wherein the first insulating layer is disposed over the semiconductor substrate and the isolation, the conductive plug extends through the first insulating layer, and each of the plurality of fins has a planar top surface. The method further includes forming an insulating layer over the first semiconductor structure; forming a capacitor plug in the insulating layer; forming a barrier layer on and attached to sidewalls of the capacitor plug; and forming a landing pad over the insulating layer and disposed on the capacitor plug.

In conclusion, because a top portion of each of the fins protruding from a substrate is planarized prior to a formation of a contact between a cell capacitor and one of the fins, an area of the contact between the cell capacitor and the fin is increased, and a curved surface of the top portion becomes a planar surface. Therefore, an overall performance of a memory device and a process of manufacturing the memory device are improved.

The foregoing has outlined rather broadly the features and technical advantages of the present disclosure in order that the detailed description of the disclosure that follows may be better understood. Additional features and technical advantages of the disclosure are described herein, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
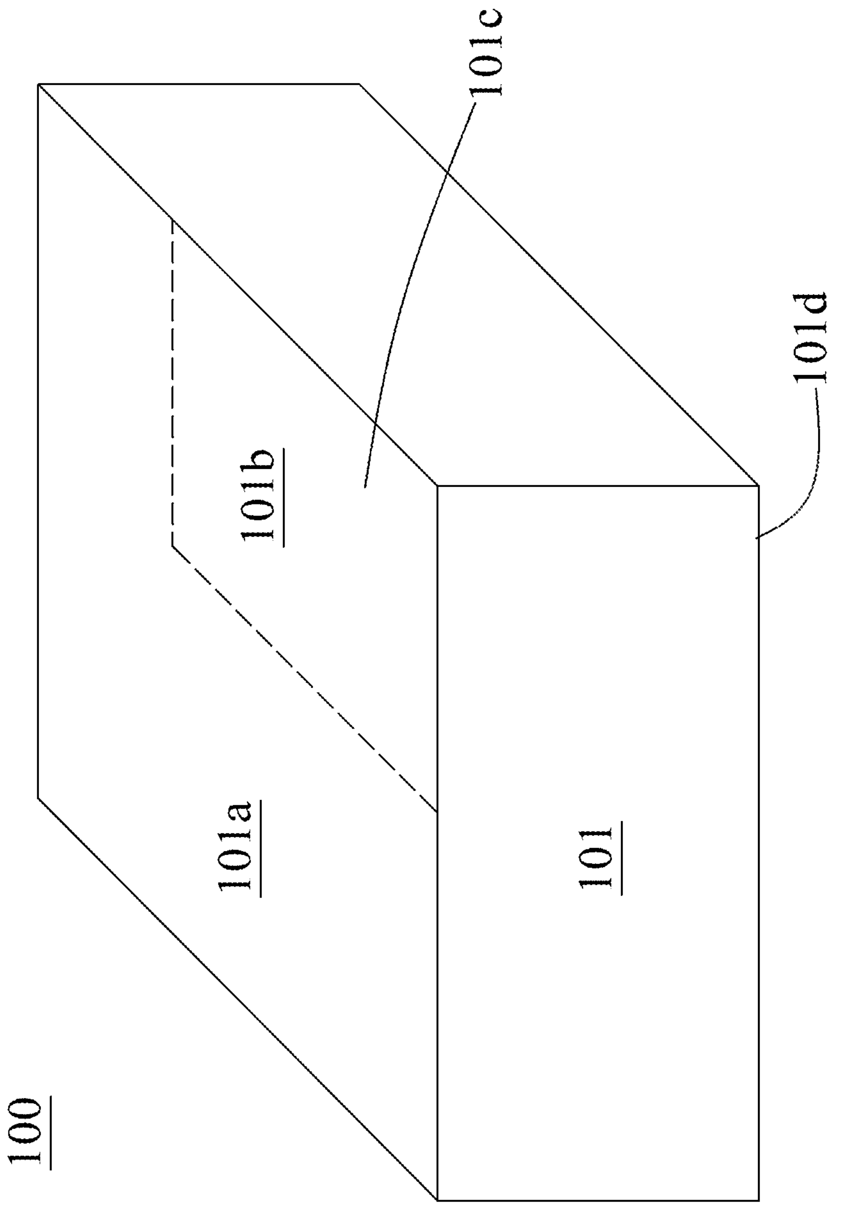
FIG. 1 is a schematic perspective view of a memory device in accordance with some embodiments of the present disclosure.

Embodiments, or examples, of the disclosure illustrated in the drawings are now described using specific language. It should be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It should be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It should be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic perspective view of a memory device 100 in accordance with some embodiments of the present disclosure. In some embodiments, the memory device 100 includes several unit cells arranged in rows and columns.

Referring to FIG. 1, the memory device 100 includes a semiconductor substrate 101. In some embodiments, the semiconductor substrate 101 includes semiconductive materials such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes a peripheral region 101*a* and an array area 101*b* at least partially surrounded by the peripheral region 101*a*. In some embodiments, the peripheral region 101*a* is adjacent to a periphery of the semiconductor substrate 101, and the array area 101*b* is adjacent to a central area of the semiconductor substrate 101. In some embodiments, the array area 101*b* may be used for fabricating transistors, capacitors or the like.

In some embodiments, the semiconductor substrate 101 includes a first surface 101*c* and a second surface 101*d* opposite the first surface 101*c*. In some embodiments, the first surface 101*c* is a front side of the semiconductor substrate 101, wherein electrical devices or components are formed over the first surface 101*c* and configured to be electrically connected to an external circuit. In some embodiments, the second surface 101*d* is a back side of the substrate 101, where electrical devices or components are absent.

Figure 2:
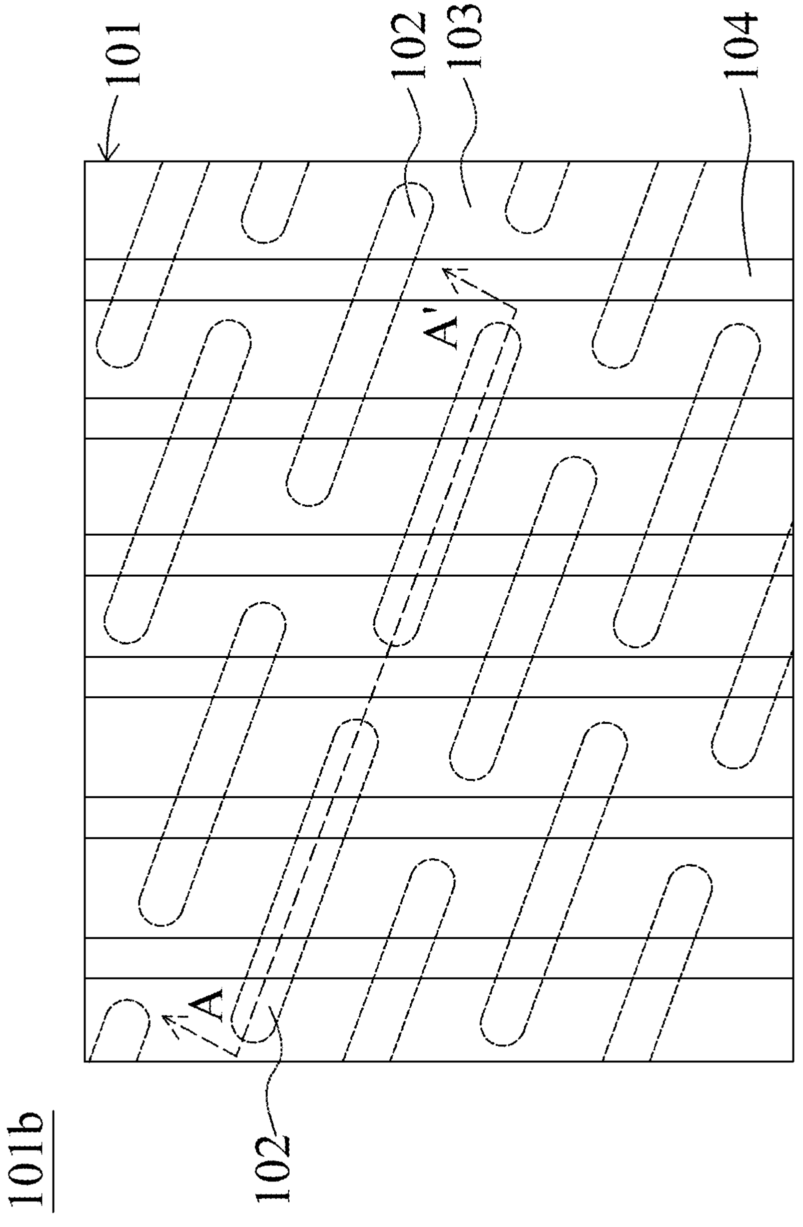
FIG. 2 is a schematic top view of an array area of the memory device of FIG. 1.

FIG. 2 is a schematic top view of the array area 101*b* of the semiconductor substrate 101 in FIG. 1. Referring to FIG. 2, the semiconductor substrate 101 includes several active areas (AA) 102. In some embodiments, the active area 102 is a doped region in the semiconductor substrate 101. In some embodiments, the active area 102 extends horizontally over or under the first surface 101*c* of the semiconductor substrate 101. In some embodiments, each of the active areas 102 includes a same type of dopant. In some embodiments, each of the active areas 102 includes a type of dopant that is different from types of dopants included in other active areas 102. In some embodiments, each of the active areas 102 has a same conductivity type. In some embodiments, the active area 102 includes n-type dopants.

In some embodiments, the memory device 100 includes an isolation 103 extending into the semiconductor substrate 101 and surrounding the active areas 102. In some embodiments, the isolation 103 extends from the first surface 101*c* toward the second surface 101*d* of the semiconductor substrate 101. In some embodiments, the isolation 103 is a shallow trench isolation (STI). In some embodiments, the isolation 103 defines a boundary of each of the active areas 102. In some embodiments, the isolation 103 is formed of an insulating material, such as silicon oxide, silicon nitride, silicon oxynitride, the like, or a combination thereof.

Figure 3A:
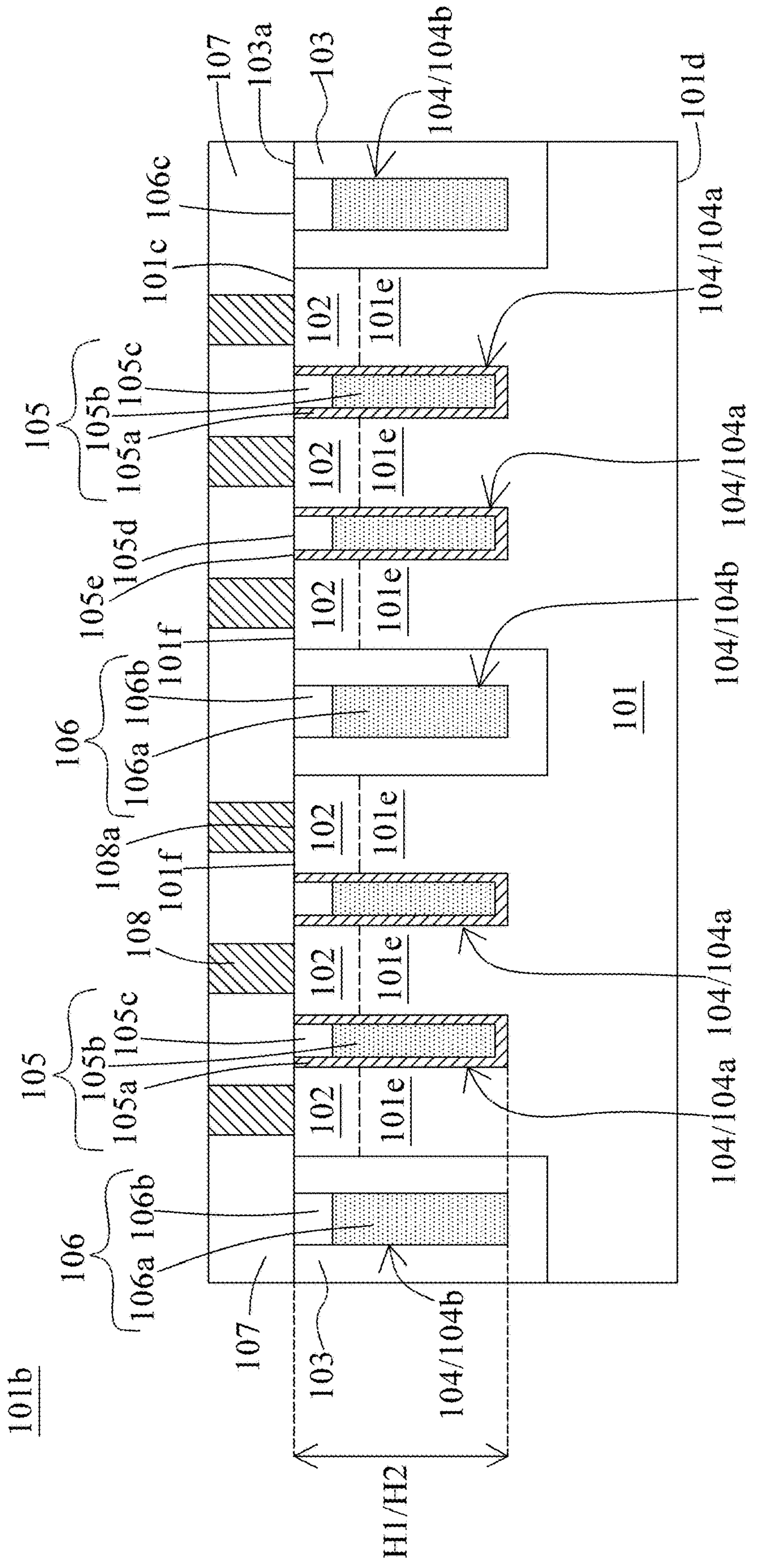
FIGS. 3A, 3B and 3C are cross-sectional views of a portion of the memory device along a line A-A' in FIG. 2 in accordance with some embodiments of the present disclosure.

FIG. 3A is a schematic cross-sectional view of the memory device 100 along a line A-A' in FIG. 2. Referring to FIG. 2 and FIG. 3, several recesses 104 are formed in the array area 101*b* of the semiconductor substrate 101 and across the active areas 102 and the isolation 103. In some embodiments, the recesses 104 include a first recess 104*a* extending into the semiconductor substrate 101 and a second recess 104*b* extending into the isolation 103. In some embodiments, the first recess 104*a* extends across one or more of the active areas 102. In some embodiments, the first recess 104*a* and the second recess 104*b* have a same depth. In some embodiments, the first recess 104*a* is shallower than the second recess 104*b*.

Referring to FIG. 3A, several fins 101*e* are formed in the semiconductor substrate 101. In some embodiments, top surfaces of the fins are coplanar with the first surface 101*c* of the semiconductor substrate 101. In some embodiments, the fins 101*e* and the first recesses 104*a* are alternately disposed. In some embodiments, a top portion of the fin 101*e* is the active area 102 of the semiconductor substrate 101. In some embodiments, each of the fins 101*e* has a first top surface 101*f* as shown in FIG. 3. In some embodiments, the first top surface 101*f* of the fin 101*e* is planar or flat.

In some embodiments, the memory device 100 includes a first word line 105 within the first recess 104*a* as shown in FIG. 3A. The first word line 105 extends into the semiconductor substrate 101. In some embodiments, the first word line 105 is disposed between an adjacent pair of the fins 101*e*. In some embodiments, at least a portion of the first word line 105 is surrounded by the active areas 102.

In some embodiments, the first word line 105 includes an oxide layer 105*a*, a first conductive member 105*b* and a first nitride layer 105*c*. In some embodiments, the oxide layer 105*a* is disposed conformal to a sidewall of the first recess 104*a*. In some embodiments, the oxide layer 105*a* is disposed conformal to surfaces of two adjacent fins 101*e*. In some embodiments, the oxide layer 105*a* contacts an entirety of the sidewall of the first recess 104*a*. In some embodiments, the oxide layer 105*a* is formed of an insulating material, such as silicon oxide, silicon nitride, silicon oxynitride, the like, or a combination thereof. In some embodiments, the oxide layer 105*a* includes dielectric material with a low dielectric constant (low k).

In some embodiments, the first conductive member 105*b* is disposed within the first recess 104*a* and surrounded by the oxide layer 105*a*. In some embodiments, the first conductive member 105*b* is isolated from the fins 101*e* by the oxide layer 105*a*. In some embodiments, the first conductive member 105*b* includes conductive material such as tungsten (W).

In some embodiments, the first nitride layer 105*c* is disposed within the first recess 104*a* and over the first conductive member 105*b*, and is surrounded by the oxide layer 105*a*. In some embodiments, the first nitride layer 105*c* is formed of an insulating material, such as silicon nitride, silicon oxynitride, the like, or a combination thereof. In some embodiments, the first nitride layer 105*c* has a second top surface 105*d* substantially coplanar with the first top surface 101*f* of the fin 101*e*. In some embodiments, the second top surface 105*d* of the first nitride layer 105*c* is planar or flat.

In some embodiments, the oxide layer 105*a* has a third top surface 105*e* substantially coplanar with the first top surface 101*f* of the fin 101*e* and the second top surface 105*d* of the first nitride layer 105*c*. In some embodiments, the third top surface 105*e* of the oxide layer 105*a* is planar or flat. In some embodiments, the third top surface 105*e* of the oxide layer 105*a* is coupled with the first top surface 101*f* of the fin 101*e* and the second top surface 105*d* of the first nitride layer 105*c*.

In some embodiments, the isolation 103 has a fourth top surface 103*a* substantially coplanar with the first top surface 101*f* of the fin 101*e*, the second top surface 105*d* of the first nitride layer 105*c* and the third top surface 105*e* of the oxide layer 105*a*. In some embodiments, the fourth top surface 103*a* is planar or flat.

In some embodiments, the memory device 100 includes a second word line 106 within the second recess 104*b* as shown in FIG. 3. In some embodiments, the second word line 106 is surrounded by the isolation 103. In some embodiments, the second word line 106 is separated from the first word line 105 by the fin 101*e*. In some embodiments, a height H1 of the first word line 105 is substantially same as a height H2 of the second word line 106. In some embodiments, the height H1 of the first word line 105 is substantially less than the height H2 of the second word line 106.

In some embodiments, the second word line 106 includes a second conductive member 106*a* within the second recess 104*b* and a second nitride layer 106*b* above the second conductive member 106*a* and within the second recess 104*b*. In some embodiments, the second conductive member 106*a* includes a conductive material such as tungsten (W). In some embodiments, the second nitride layer 106*b* is formed of an insulating material, such as silicon nitride, silicon oxynitride, the like, or a combination thereof.

In some embodiments, the second nitride layer 106*b* has a fifth top surface 106*c* substantially coplanar with the first top surface 101*f* of the fin 101*e*, the second top surface 105*d* of the first nitride layer 105*c*, the third top surface 105*e* of the oxide layer 105*a*, and the fourth top surface 103*a* of the isolation 103. In some embodiments, the fifth top surface 106*c* of the second nitride layer 106*b* is a planar or flat surface. In some embodiments, the fifth top surface 106*c* of the second nitride layer 106*b* is coupled with the fourth top surface 103*a* of the isolation 103.

Referring to FIG. 3, the memory device 100 further includes a first insulating layer 107 over the semiconductor substrate 101 and the isolation 103, and a conductive plug 108 extending through the first insulating layer 107. In some embodiments, the first insulating layer 107 covers the isolation 103, the second word line 106, the first word line 105 and at least a portion of the fin 101*e*. In some embodiments, the first insulating layer 107 is formed of an insulating material, such as silicon oxide, silicon nitride, silicon oxynitride, the like, or a combination thereof.

In some embodiments, the conductive plug 108 contacts the first top surface 101*f* of the fin 101*e*. In some embodiments, an interface 108*a* between the conductive plug 108 and the fin 101*e* is a planar interface. In some embodiments, the interface 108*a* is disposed between the conductive plug 108 and the first top surface 101*f* of the fin 101*e*. In some embodiments, the conductive plug 108 is formed of conductive material such as copper, silver or the like. In some embodiments, the conductive plug 108 is configured to electrically connect to a capacitor disposed above the first insulating layer 107.

Figure 3B:
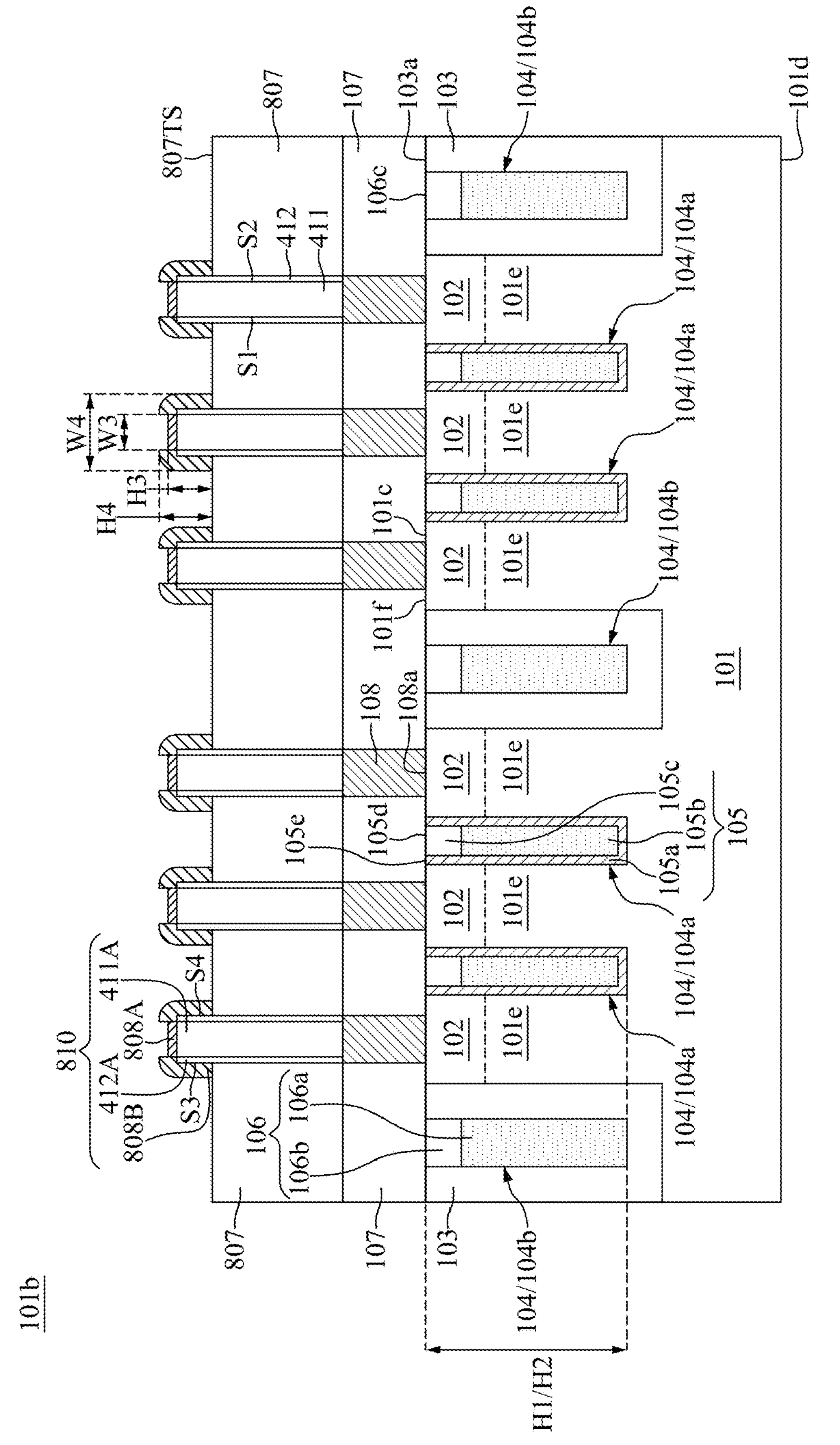

FIG. 3B is a cross-sectional view of a portion of the memory device 100 along the line A-A' in FIG. 2 in accordance with some embodiments of the present disclosure. As shown in FIG. 3A, the memory device 100 may further comprise a landing pad 810 disposed on the conductive plug 108.

Referring to FIG. 3B, a second insulating layer 807 is formed over the first insulating layer 107, and a capacitor plug 411 is formed in the second insulating layer 807. The second insulating layer 807 may be made of a material same as that of the first insulating layer 107, but is not limited thereto. The second insulating layer 807 is formed by a process same as that of the first insulating layer 107. The capacitor plug 411 is formed by processes comprising: performing a photolithography process to define a position of the capacitor plug 411; performing an etching process, such as an anisotropic dry etching process, to form a capacitor plug opening (not shown) extending through the second insulating layer 807; depositing a conductive material over the second insulating layer 807 and in the capacitor plug opening; performing a metallization process in the capacitor plug opening to form the capacitor plug 411 over the conductive plug 108; and performing a planarization process, such as chemical mechanical polishing, to remove excess deposited material, thus providing a substantially flat surface for subsequent processing steps. In some embodiments, the conductive material comprises aluminum, copper, tungsten, cobalt, or another suitable metal or metal alloy. In some embodiments, the metallization process is a chemical vapor deposition, a physical vapor deposition, or a sputtering. In some embodiments, a barrier layer 412 is disposed between the capacitor plug 411 and the second insulating layer 807. The barrier layer 412 is disposed on and attached to sidewalls of the capacitor plug 411. The barrier layer 412 is made of titanium (Ti), titanium nitride (TiN), or a combination thereof.

Referring to FIG. 3A, a protruding portion 411A of the capacitor plug 411 and a top portion 412A of the barrier layer 412 may protrude from the second insulating layer 807. In some embodiments, an etch-back process is performed to remove a top portion of the second insulating layer 807 to expose the protruding portion 411A of the capacitor plug 411 and the top portion 412A of the barrier layer 412. In some embodiments, after the etch-back process, a top surface of the capacitor plug 411 is higher than a top surface of the second insulating layer 807, and a sidewall of the top portion 412A of the barrier layer 412 is exposed.

Referring to FIG. 3B, the landing pad 810 is formed over the second insulating layer 807. First, a deposition process is performed to form a liner layer (not shown), wherein the liner layer covers the top surface of the second insulating layer 807, a top surface of the protruding portion 411A, and the sidewalls of the top portion 412A. In some embodiments, the liner layer is a silicon-containing layer, such as a polysilicon layer. Next, a thermal process is performed to form the landing pad 810 over the second insulating layer 807. In some embodiments, a silicide process (thermal process) is performed to form the landing pad 810 over the second insulating layer 807, wherein the landing pad 810 comprises the protruding portion 411A of the capacitor plug 411, the top portion 412A of the barrier layer 412, a first silicide layer (metal silicide) 808A over the protruding portion 411A, and a second silicide layer (metal silicide) 808B on a sidewall of the protruding portion 411A. In some embodiments, the thermal process transforms a portion of the protruding portion 411A and the liner layer into the first silicide layer 808A. In some embodiments, the thermal process transforms the top portion 412A of the barrier layer 412 and the liner layer into the second silicide layer 808B. In other words, the materials of the first silicide layer 808A and the second silicide layer 808B are different. The landing pad 810 is formed without using the lithographic technique, i.e., the landing pad 810 is self-aligned with the capacitor plug 411. In some embodiments, a thickness and a shape of the protruding portion 411A and the top portion 412A may be changed (not shown in the drawings).

In addition, an etching process, such as an anisotropic dry etching process, may be performed to remove a portion of the liner layer not transformed into the metal silicide by the thermal process. In some embodiments, the silicide process between the top portion 412A and the liner layer proceeds more quickly than the silicide process between the protruding portion 411A and the liner layer 808, and a top end of the second silicide layer 808B is higher than a top surface of the first silicide layer 808A. In other words, since a height H4 of the second silicide layer 808B is greater than a height H3 of the first silicide layer 808A, a step structure is formed between the first silicide layer 808A and the second silicide layer 808B. In some embodiments, the second silicide layer 808B surrounds the first silicide layer 808A, and a width W4 of the second silicide layer 808B is greater than a width W3 of the first silicide layer 808A.

Figure 3C:
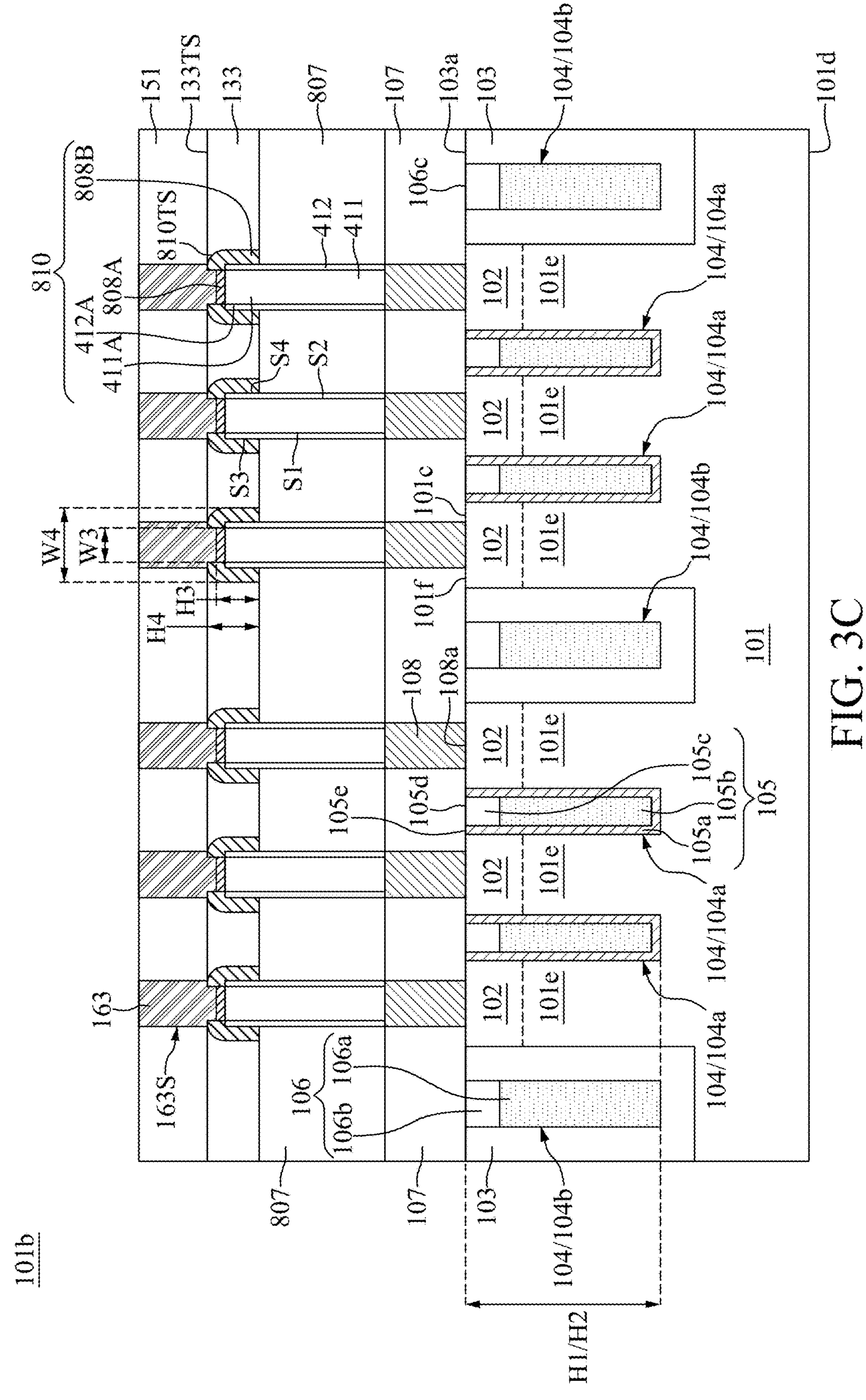

FIG. 3C is a cross-sectional view of a portion of the memory device 100 along the line A-A' in FIG. 2 in accordance with some embodiments of the present disclosure. With respect to FIG. 3B, the memory device 100 in FIG. 3C may further comprise a metal plug 163 disposed on the landing pad 810.

Referring to FIG. 3C, a patterned mask 133 is disposed over the second insulating layer 807, a fifth dielectric layer 151 is disposed over the patterned mask 133, and a metal plug 163 is disposed in the fifth dielectric layer 151. In some embodiments, the metal plug 163 directly contacts the first silicide layer 808A and the second silicide layer 808B. It should be noted that a sidewall 163S of the metal plug 163 is partially covered by the second silicide layer 808B in accordance with some embodiments. In some embodiments, the metal plug 163 is electrically connected to the capacitor plug 411 through the first silicide layer 808A and the second silicide layer 808B. In some embodiments, the metal plug 163 is made of tungsten (W), aluminum (Al), copper (Cu), titanium (Ti), tantalum (Ta), a combination thereof, or another applicable metal material. Formation of the metal plug 163 may include a deposition process and a planarization process. The deposition process may be a CVD process, a PVD process, an ALD process, a MOCVD process, a sputtering process, a plating process, or another applicable process. The planarization process may include a CMP process.

Figure 4:
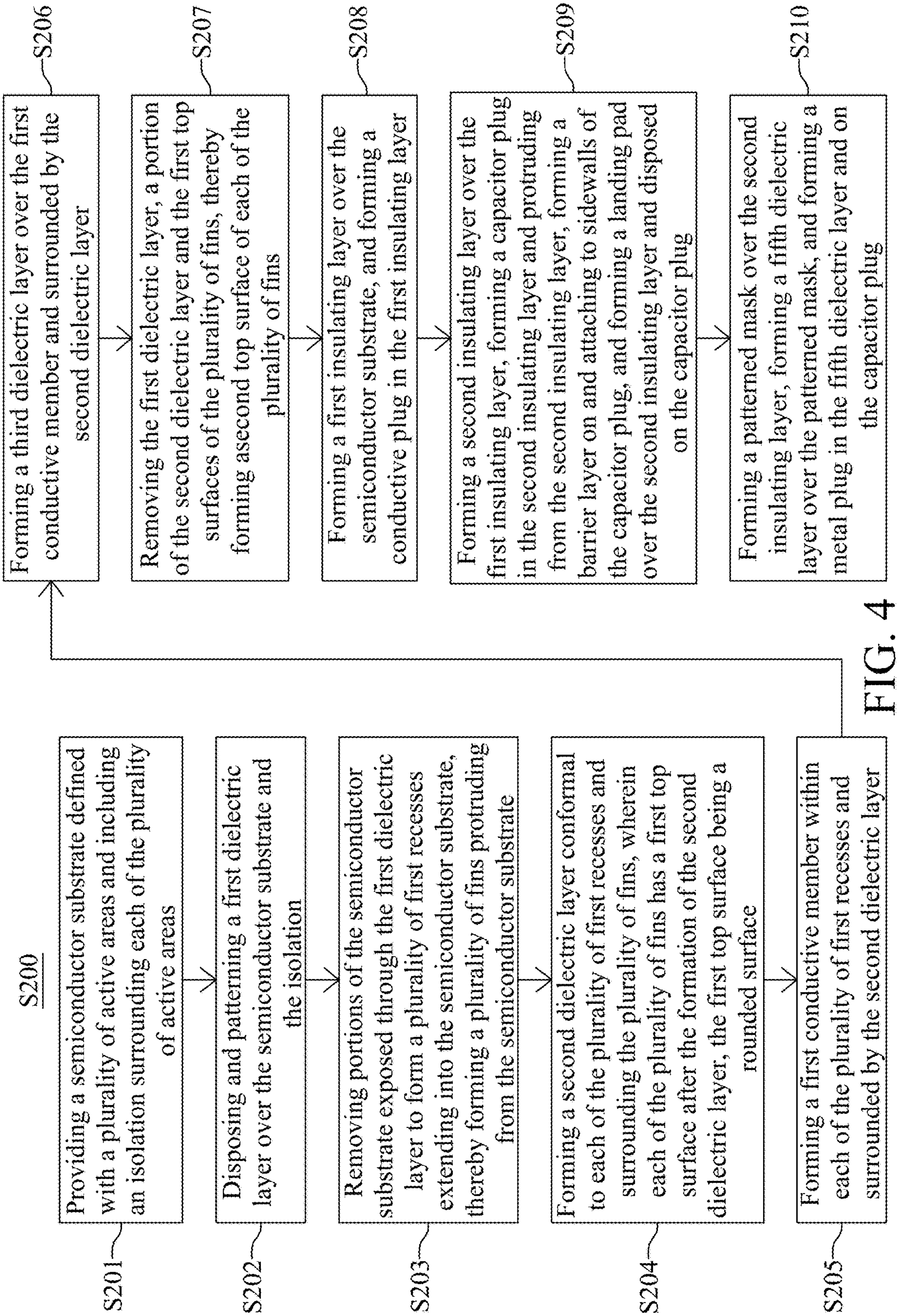
FIG. 4 is a flow diagram illustrating a method of manufacturing a memory device in accordance with some embodiments of the present disclosure.

FIG. 4 is a flow diagram illustrating a method S200 of manufacturing a memory device 100 in accordance with some embodiments of the present disclosure, and FIGS. 5 to 29 illustrate schematic views of intermediate stages in the formation of the memory device 100 in accordance with some embodiments of the present disclosure.

The stages shown in FIGS. 5 to 29 are also illustrated schematically in the flow diagram in FIG. 4. The fabrication stages shown in FIGS. 5 to 29 are discussed with reference to process steps shown in FIG. 4. The method S200 includes a number of operations, and description and illustration are not deemed as a limitation to a sequence of the operations. The method S200 includes a number of steps (S201, S202, S203, S204, S205, S206, S207, S208, S209 and S210).

In some embodiments, the method S200 includes providing a semiconductor substrate defined with a plurality of active areas and including an isolation surrounding each of the plurality of active areas (S201); disposing and patterning a first dielectric layer over the semiconductor substrate and the isolation (S202); removing portions of the semiconductor substrate exposed through the first dielectric layer to form a plurality of first recesses extending into the semiconductor substrate, thereby forming a plurality of fins protruding from the semiconductor substrate (S203); forming a second dielectric layer conformal to each of the plurality of first recesses and surrounding the plurality of fins, wherein each of the plurality of fins has a first top surface after the formation of the second dielectric layer, the first top surface being a rounded surface (S204); forming a first conductive member within each of the plurality of first recesses and surrounded by the second dielectric layer (S205); forming a third dielectric layer over the first conductive member and surrounded by the second dielectric layer (S206); removing the first dielectric layer, a portion of the second dielectric layer, and the first top surfaces of the plurality of fins, thereby forming a second top surface of each of the plurality of fins, wherein the second top surface is a planar surface (S207); forming a first insulating layer over the semiconductor substrate, and forming a conductive plug in the first insulating layer (S208); forming a second insulating layer over the first insulating layer, forming a capacitor plug in the second insulating layer and protruding from the second insulating layer, forming a barrier layer on and attached to sidewalls of the capacitor plug, and forming a landing pad over the second insulating layer and disposed on the capacitor plug (S209); and forming a patterned mask over the second insulating layer, forming a fifth dielectric layer over the patterned mask, and forming a metal plug in the fifth dielectric layer and on the capacitor plug (S210).

Figure 5:
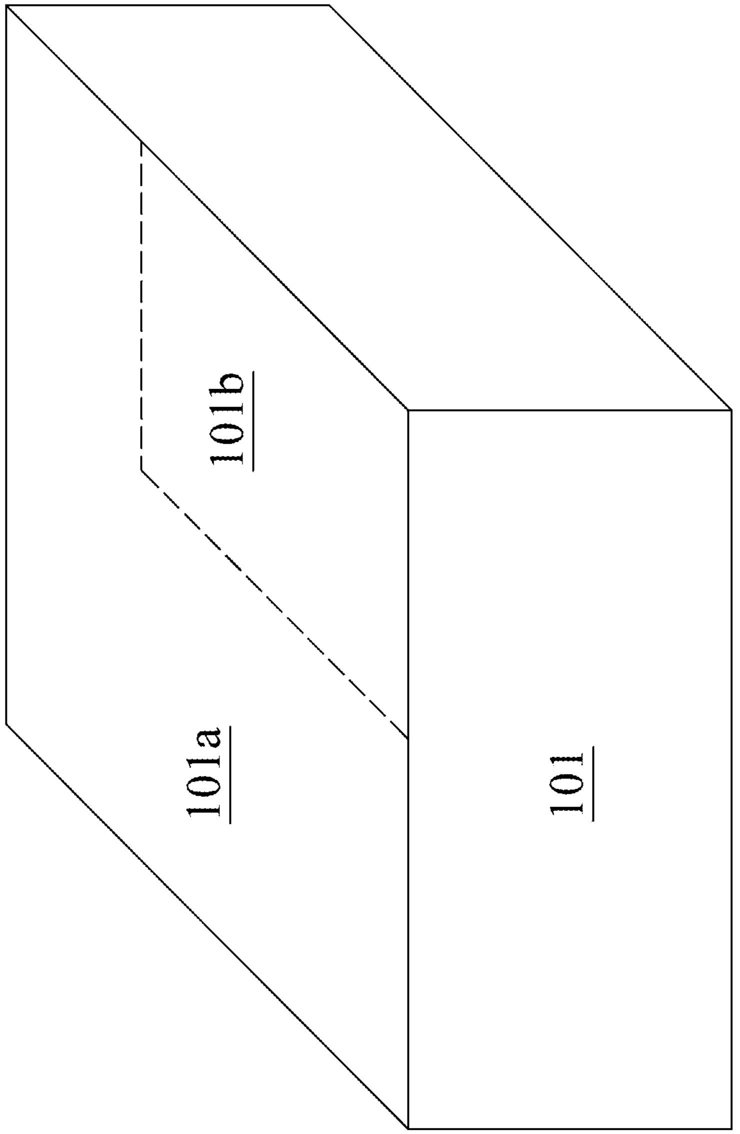
FIGS. 5 to 29 illustrate cross-sectional views of intermediate stages in the formation of a memory device in accordance with some embodiments of the present disclosure.

Referring to FIG. 5, a semiconductor substrate 101 is provided in accordance with step S201 in FIG. 4. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate.

In some embodiments, the semiconductor substrate 101 includes a peripheral region **101*a* and an array area 101*b* at least partially surrounded by the peripheral region 101*a*. In some embodiments, the peripheral region 101*a* is adjacent to a periphery of the semiconductor substrate 101, and the array area 101*b* is adjacent to a central area of the semiconductor substrate 101. In some embodiments, the array area 101*b*** may be used for fabricating transistors, capacitors or the like.

Figure 6:
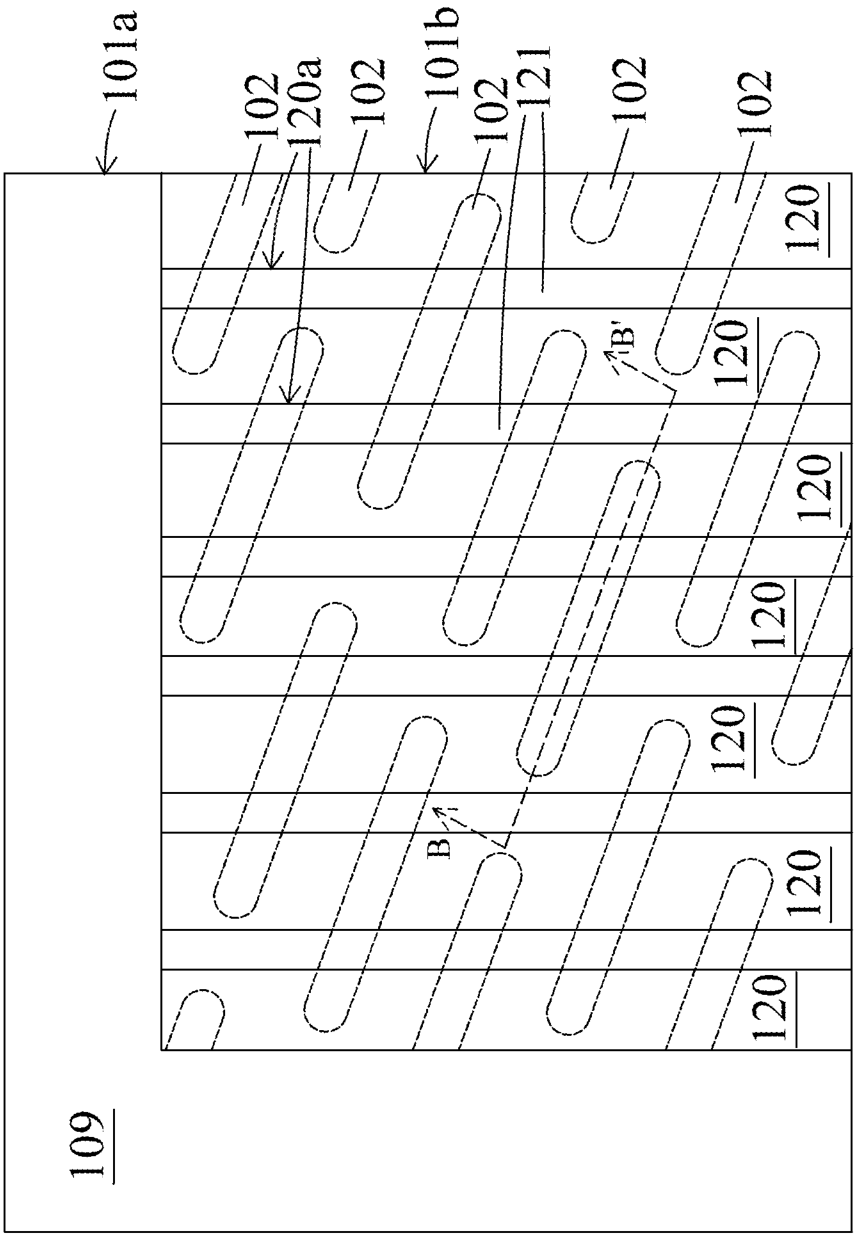

FIG. 6 is a schematic top view of the semiconductor substrate 101 of FIG. 5. In some embodiments, the peripheral region **101*a* is covered by a peripheral photoresist 109 as shown in FIG. 6. In some embodiments, the peripheral photoresist 109 is configured to protect components in the peripheral region 101*a*. In some embodiments, the array area 101*b* is exposed through the peripheral photoresist 109 as shown in FIG. 6**.

Figure 7:
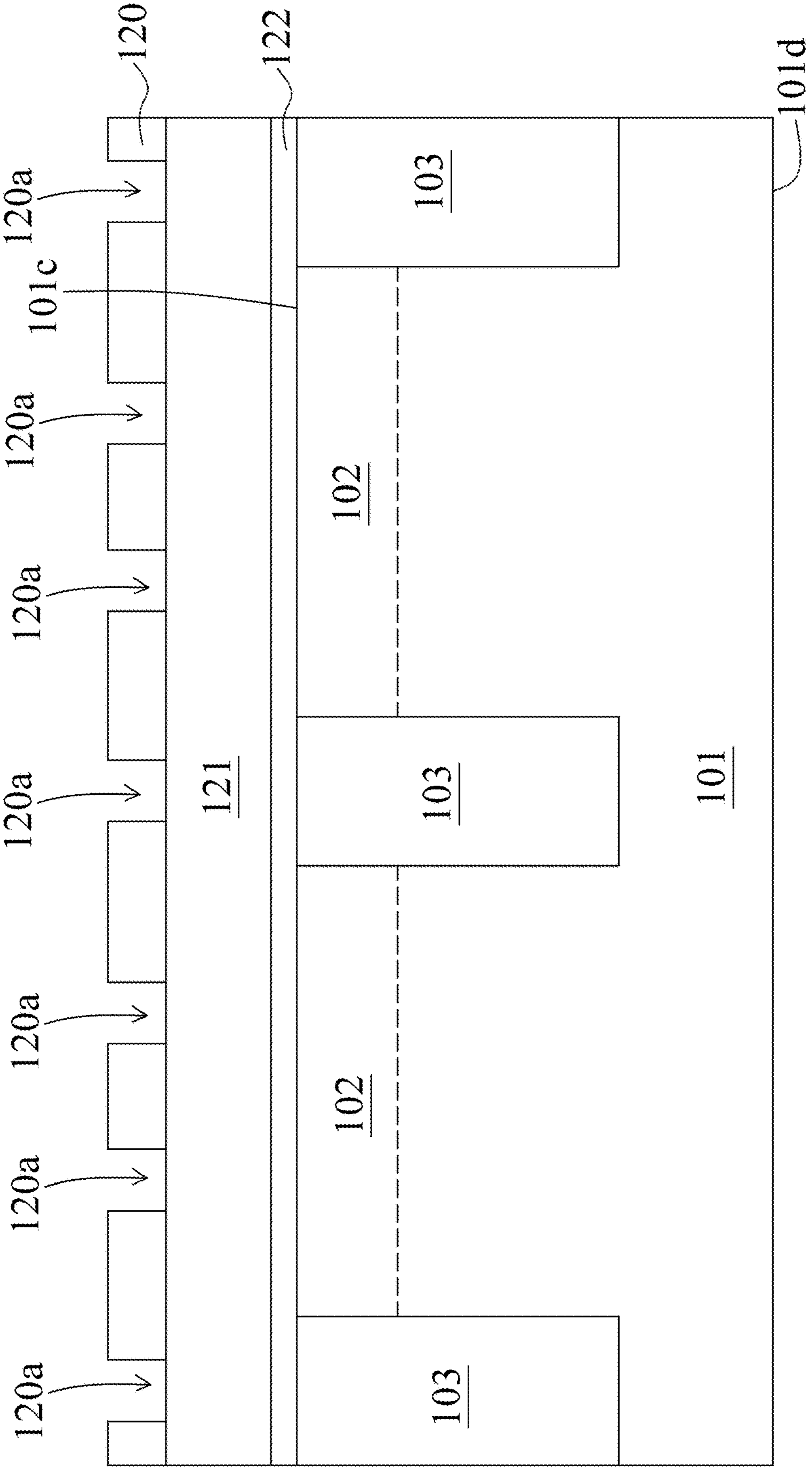

FIG. 7 is a schematic cross-sectional view of a portion of the array area **101*b* along a line B-B' in FIG. 6. In some embodiments, the semiconductor substrate 101 includes several active areas (AA) 102. In some embodiments, the active area 102 is a doped region in the semiconductor substrate 101. In some embodiments, each of the active areas 102 includes a same type of dopant. In some embodiments, each of the active areas 102 includes a type of dopant that is different from types of dopants included in other active areas 102. In some embodiments, each of the active areas 102** has a same conductivity type.

In some embodiments, an isolation 103 extends into the semiconductor substrate 101 and surrounds the active area 102. In some embodiments, the isolation 103 is a shallow trench isolation (STI). In some embodiments, the isolation 103 defines a boundary of one of the active areas 102. In some embodiments, the isolation 103 is formed of an insulating material, such as silicon oxide, silicon nitride, silicon oxynitride, the like, or a combination thereof.

In some embodiments, in accordance with step S202 in FIG. 4, a first dielectric layer 122 is disposed over the semiconductor substrate 101 and the isolation 103. In some embodiments, the first dielectric layer 122 is disposed by deposition, chemical vapor deposition (CVD) or any other suitable process. Next, in some embodiments, the first dielectric layer 122 is covered by several mask layers as shown in FIG. 7. In some embodiments, the mask layers include a second mask layer 121 over the first dielectric layer 122 and a first mask layer 120 over the second mask layer 121. In some embodiments, the first mask layer 120 includes insulating material such as oxide or the like. In some embodiments, the first mask layer 120 includes silicon dioxide. In some embodiments, the first mask layer 120 includes several first trenches **120*a* cutting through the first mask layer 120 and extending over the semiconductor substrate 101 and the isolation 103. In some embodiments, the second mask layer 121 is at least partially exposed through the first mask layer 120. In some embodiments, the second mask layer 121** includes carbon or the like.

Figure 8:
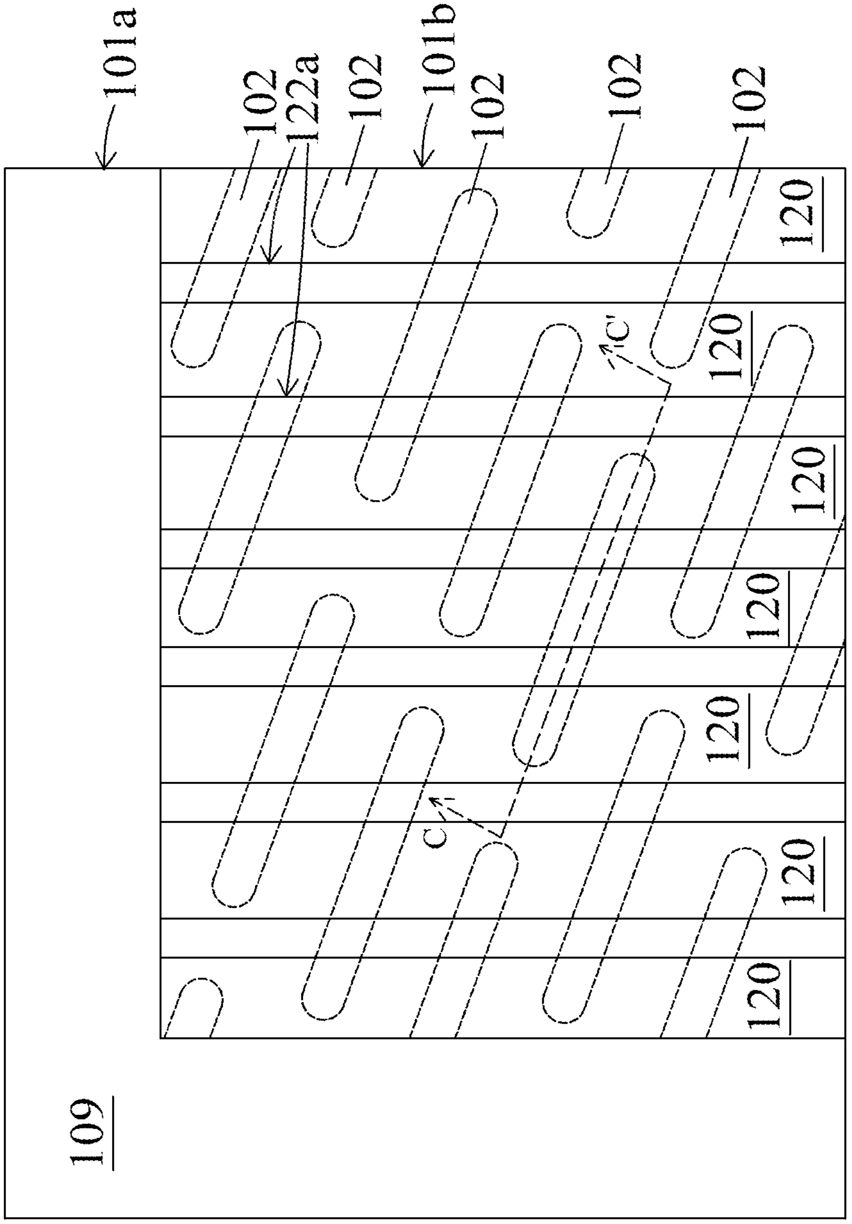
Figure 9:
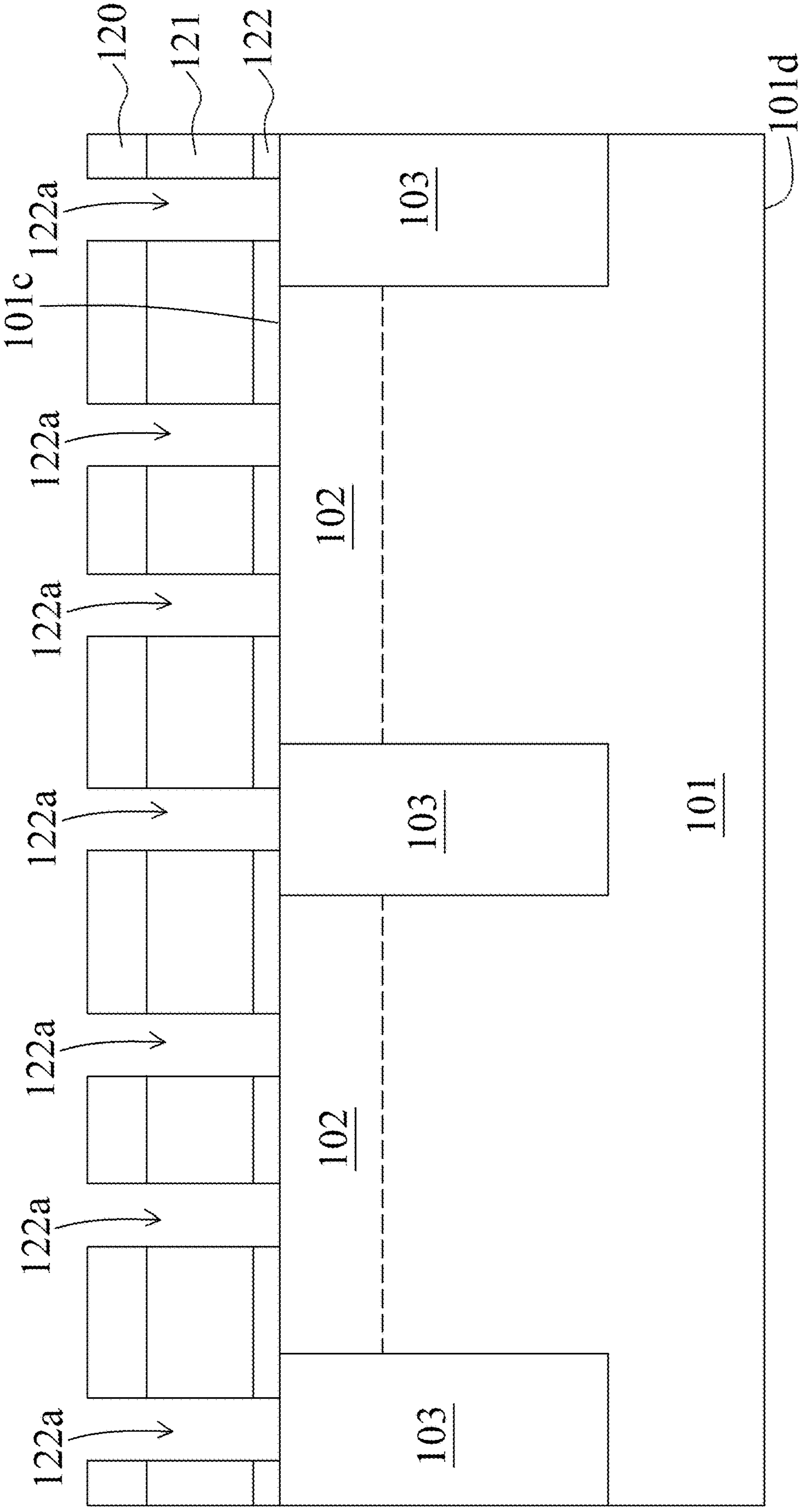
Figure 10:
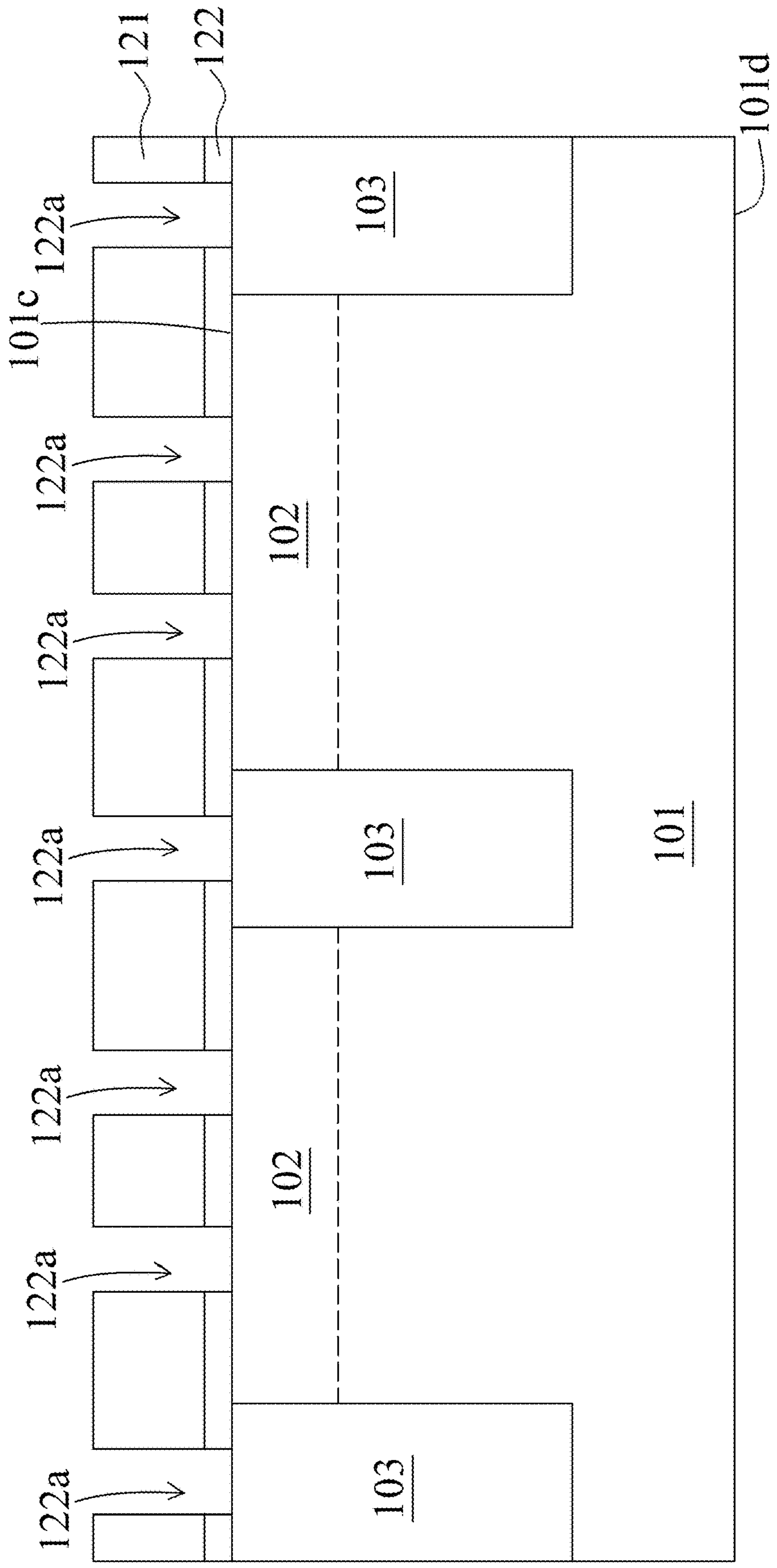

Next, as shown in FIGS. 8 and 9, the first dielectric layer 122 is patterned. In some embodiments, portions of the first dielectric layer 122 and the second mask layer 121 exposed through the first mask layer 120 are removed to form several second trenches **122*a* as shown in FIGS. 8 and 9. FIG. 8 is a schematic top view of the peripheral region 101*a* and the array area 101*b* after the formation of the second trenches 122*a*, and FIG. 9 is a schematic cross-sectional view along a line C-C' in FIG. 8**. In some embodiments, the isolation 103 and the active areas 102 are at least partially exposed by the second trenches 122*a*. After the formation of the second trenches 122*a*, the first mask layer 120 is removed as shown in FIG. 10.

Figure 11:
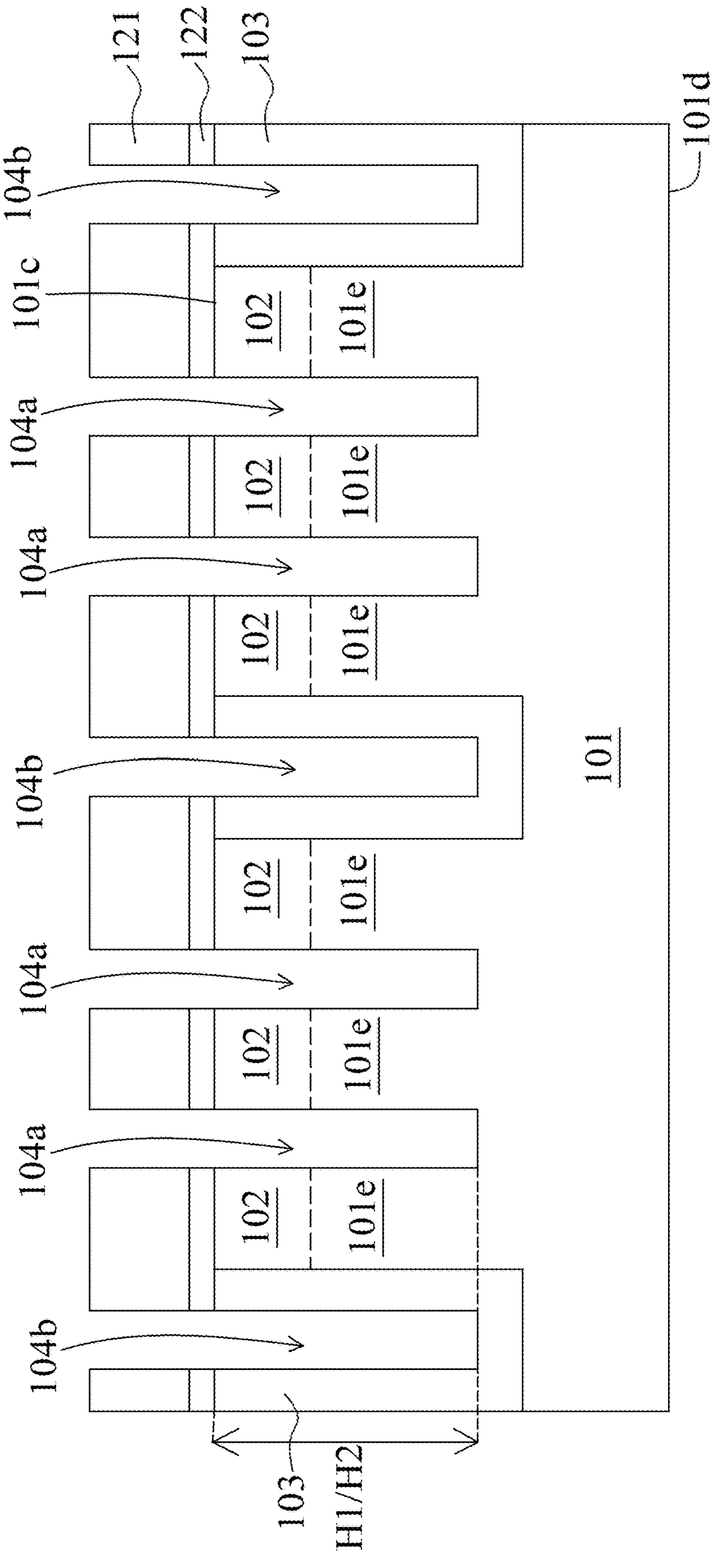

Referring to FIG. 11, portions of the semiconductor substrate 101 exposed through the first dielectric layer 122 and the second mask layer 121 are removed to form several first recesses 104*a* in accordance with step S203 in FIG. 4. In some embodiments, the portions of the semiconductor substrate 101 are removed by dry etching or any other suitable process. In some embodiments, the first recess 104*a* extends into the semiconductor substrate 101, so that several fins 101*e* protruding from the semiconductor substrate 101 are formed. In some embodiments, the fins 101*e* and the first recesses 104*a* are alternately disposed.

In some embodiments, portions of the isolation 103 exposed through the first dielectric layer 122 and the second mask layer 121 are removed to form several second recesses 104*b* as shown in FIG. 11. In some embodiments, the second recess 104*b* extends into the isolation 103. In some embodiments, the portions of the isolation 103 are removed by dry etching or any other suitable process. In some embodiments, the first recesses 104*a* and the second recesses 104*b* are alternately disposed. In some embodiments, a height H1 of the first recess 104*a* is substantially same as a height H2 of the second recess 104*b*. In some embodiments, the height H1 of the first recess 104*a* is substantially less than the height H2 of the second recess 104*b*. In some embodiments, the first recesses 104*a* and the second recesses 104*b* are formed simultaneously or sequentially.

Figure 12:
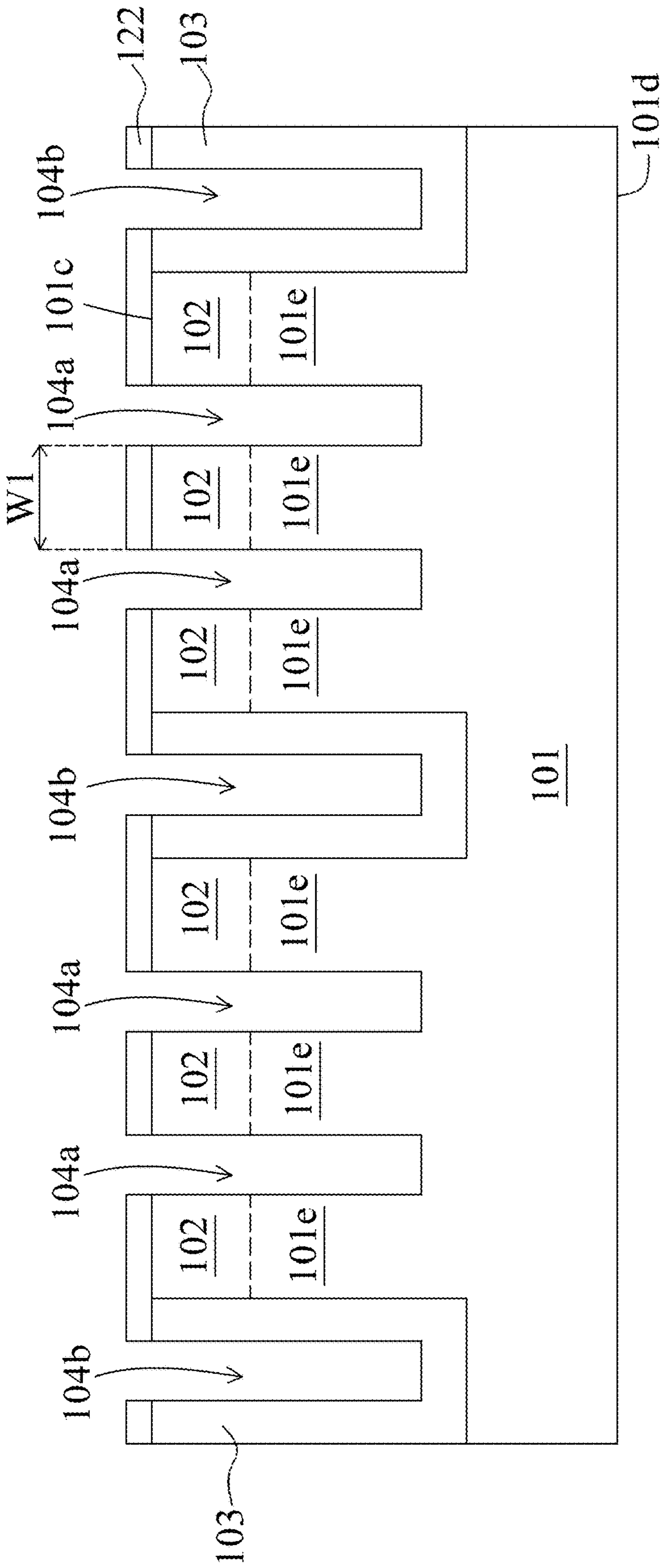

In some embodiments, the second mask layer 121 is removed after the formation of the first recesses 104*a* as shown in FIG. 12. In some embodiments, the second mask layer 121 is removed after the formation of the second recesses 104*b*. In some embodiments, the second mask layer 121 is removed by etching or any other suitable process.

Figure 13:
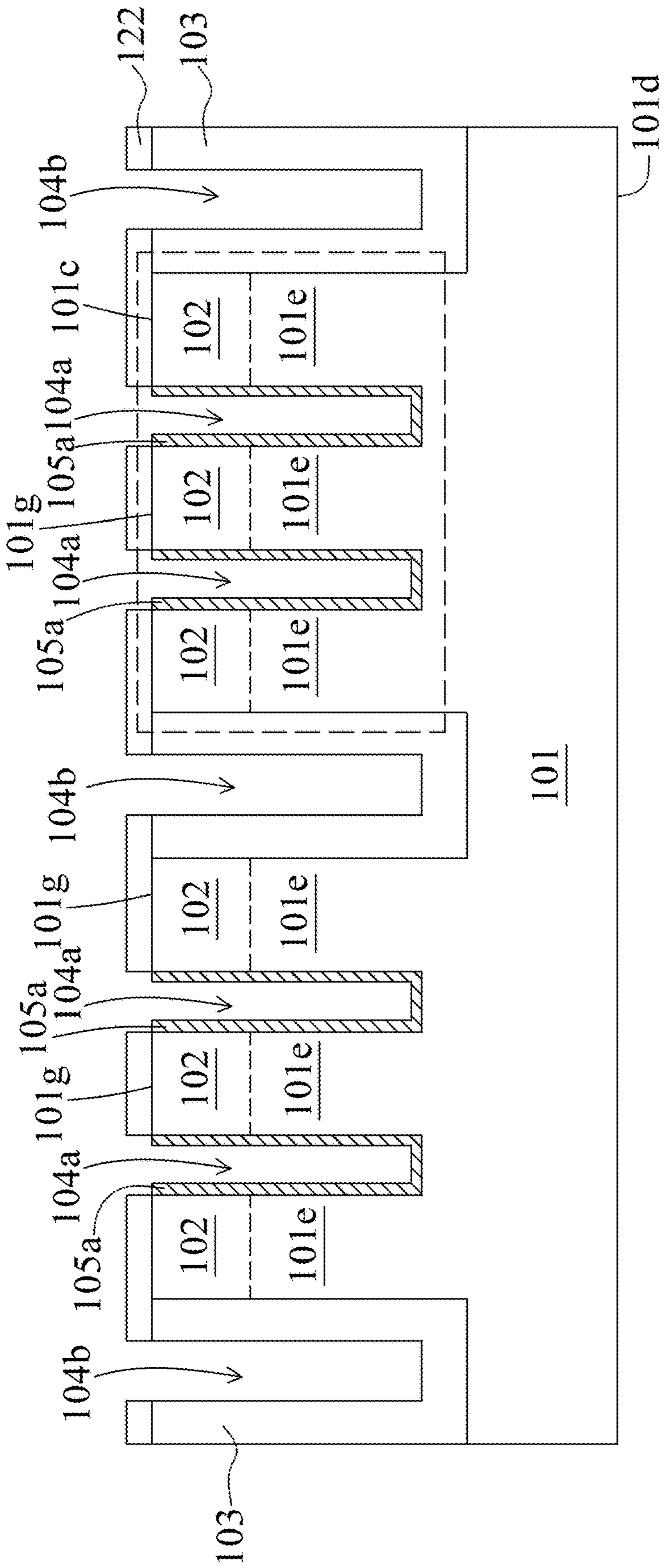

Referring to FIG. 13, a second dielectric layer 105*a* is formed in accordance with step S204 in FIG. 4. In some embodiments, the second dielectric layer 105*a* is conformal to the first recess 104*a* and surrounds the fins 101*e*. In some embodiments, the second dielectric layer 105*a* is formed on a bottom and sidewalls of the first recess 104*a*. In some embodiments, the second dielectric layer 105*a* is formed by thermal oxidation or any other suitable process. In some embodiments, the formation of the second dielectric layer 105*a* includes consuming a surface of the fin 101*e* exposed through the first recess 104*a*. In some embodiments, a width W1 of the fin 101*e* (as shown in FIG. 12) is reduced after the formation of the second dielectric layer 105*a*. In some embodiments, the second dielectric layer 105*a* is an oxide layer. In some embodiments, the second dielectric layer 105*a* is a silicon dioxide layer.

Figure 14:
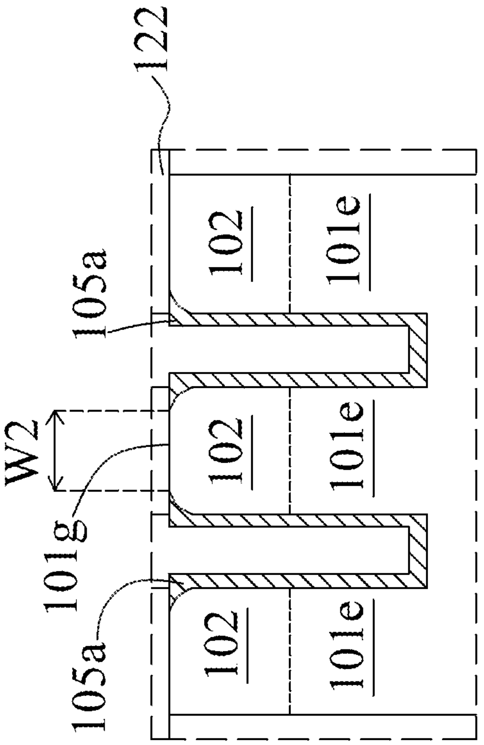

In some embodiments, a rounded top surface 101*g* of the fin 101*e* is formed after the formation of the second dielectric layer 105*a* as shown in FIG. 14. FIG. 14 is an enlarged view of a portion enclosed by dashed lines in FIG. 13. In some embodiments, the rounded top surface 101*g* is a convex surface. In some embodiments, a portion of the second dielectric layer 105*a* is disposed between the first dielectric layer 122 and the rounded top surface 101*g* of the fin 101*e*. In some embodiments, the second dielectric layer 105*a* contacts portions of the fins 101*e* exposed through the first recesses 104*a*. In some embodiments, a portion of the rounded top surface 101*g* contacting the first dielectric layer 122 has a width W2 substantially less than the width W1 of the fin 101*e*.

Figure 15:
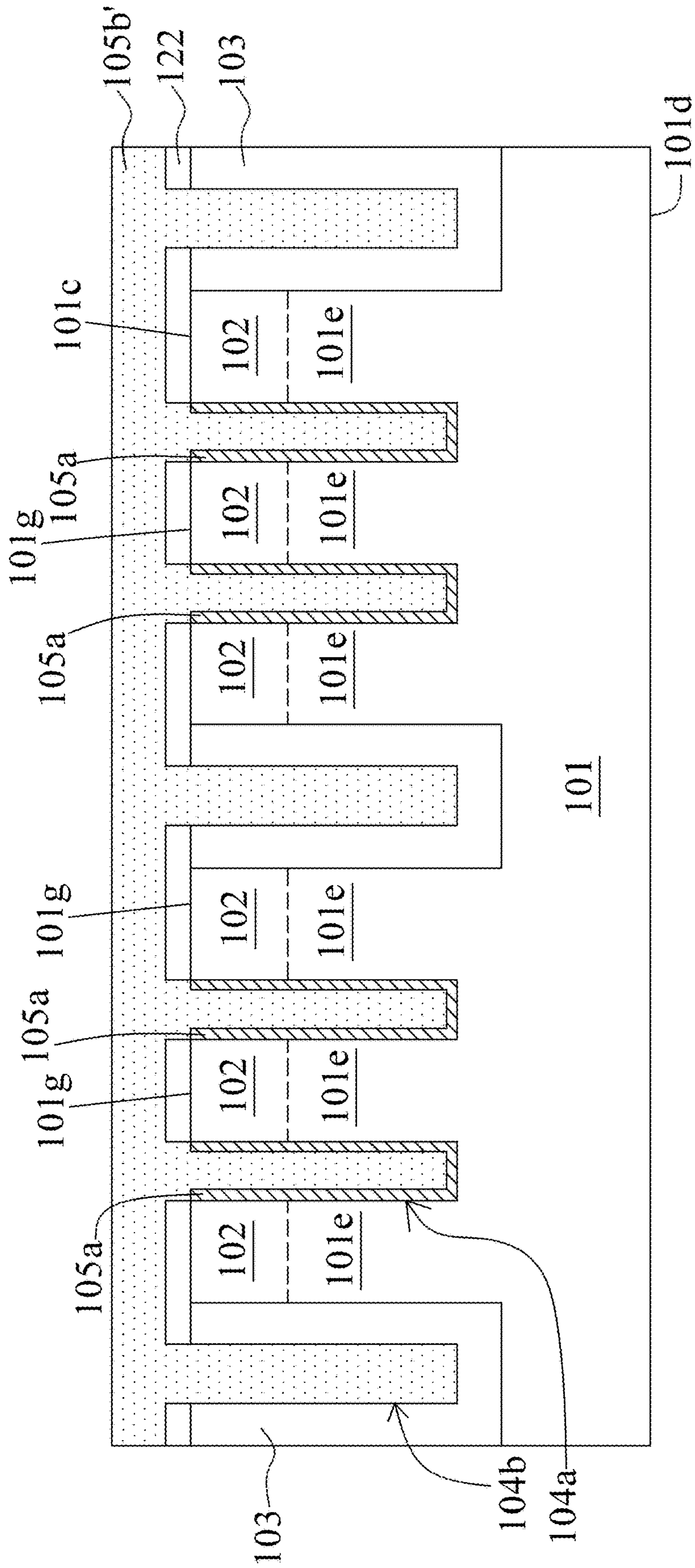
Figure 16:
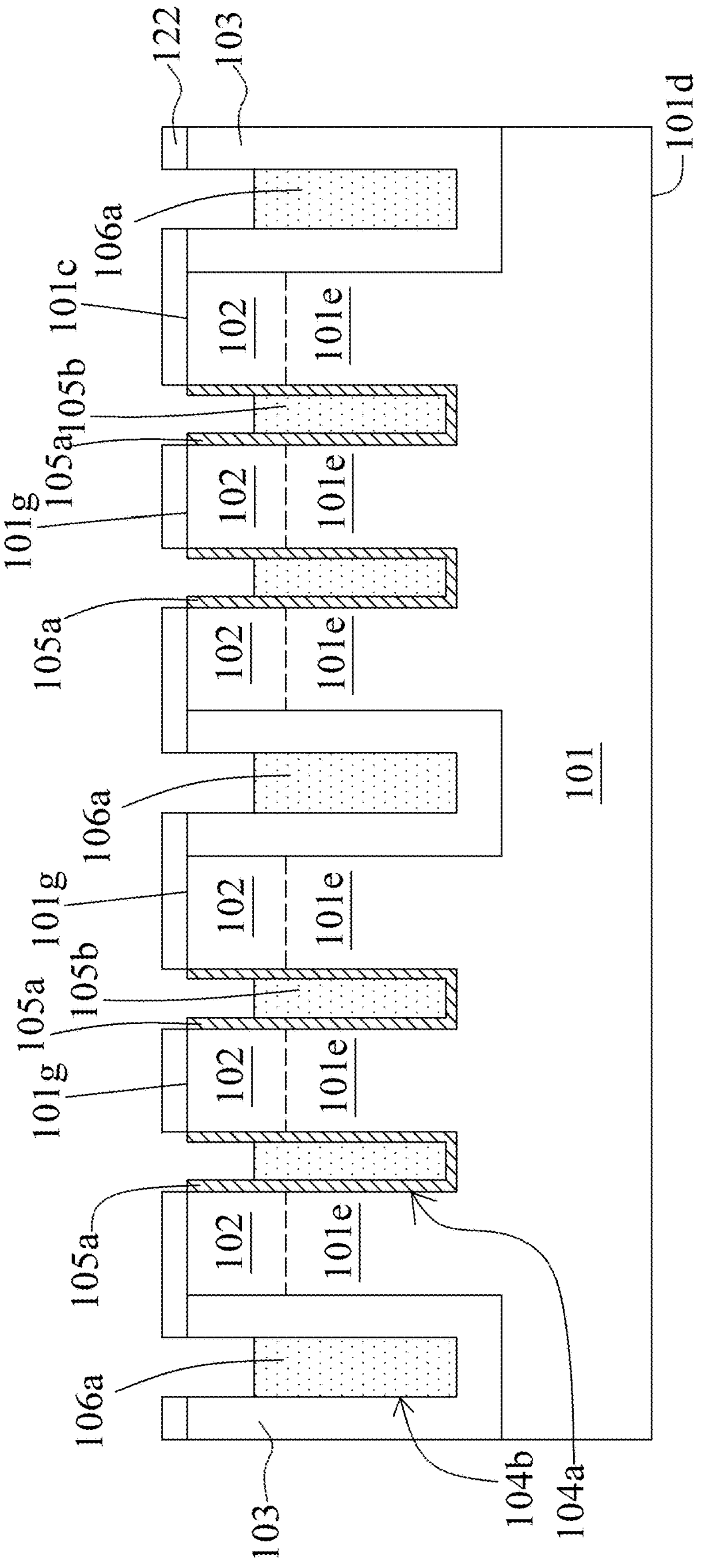

Referring to FIGS. 15 and 16, a first conductive member 105*b* is formed in accordance with step S205 in FIG. 4. In some embodiments, the first conductive member 105*b* is surrounded by the second dielectric layer 105*a*. In some embodiments, the formation of the first conductive member 105*b* includes disposing a conductive material 105*b*' into the first recesses 104*a* and over the first dielectric layer 122 and the second dielectric layer 105*a* as shown in FIG. 15, and then removing portions of the conductive material 105*b*' over the first dielectric layer 122 and within the first recesses 104*a* as shown in FIG. 16. In some embodiments, at least a small amount of the second dielectric layer 105*a* is exposed above the conductive material 105*b*' after the removal of the portions of the conductive material 105*b*'. In some embodiments, at least a small amount of the conductive material 105*b*' is surrounded by the active areas 102 after the removal of the portions of the conductive material 105*b*'. In some embodiments, the conductive material 105*b*' includes tungsten or the like. In some embodiments, the conductive material 105*b*' is disposed by deposition or any other suitable process. In some embodiments, the portions of the conductive material 105*b*' are removed by etching back or any other suitable process.

In some embodiments, a second conductive member 106*a* is formed as shown in FIG. 16. In some embodiments, the second conductive member 106*a* is formed within the second recess 104*b* and surrounded by the isolation 103. In some embodiments, the formation of the second conductive member 106*a* includes disposing the conductive material 105*b*' into the second recesses 104*b* and over the first dielectric layer 122 as shown in FIG. 15, and then removing the portions of the conductive material 105*b*' over the first dielectric layer 122 and portions of the conductive material 105*b*' within the second recesses 104*b* as shown in FIG. 16. In some embodiments, the first conductive member 105*b* and the second conductive member 106*a* are formed separately or simultaneously.

Figure 17:
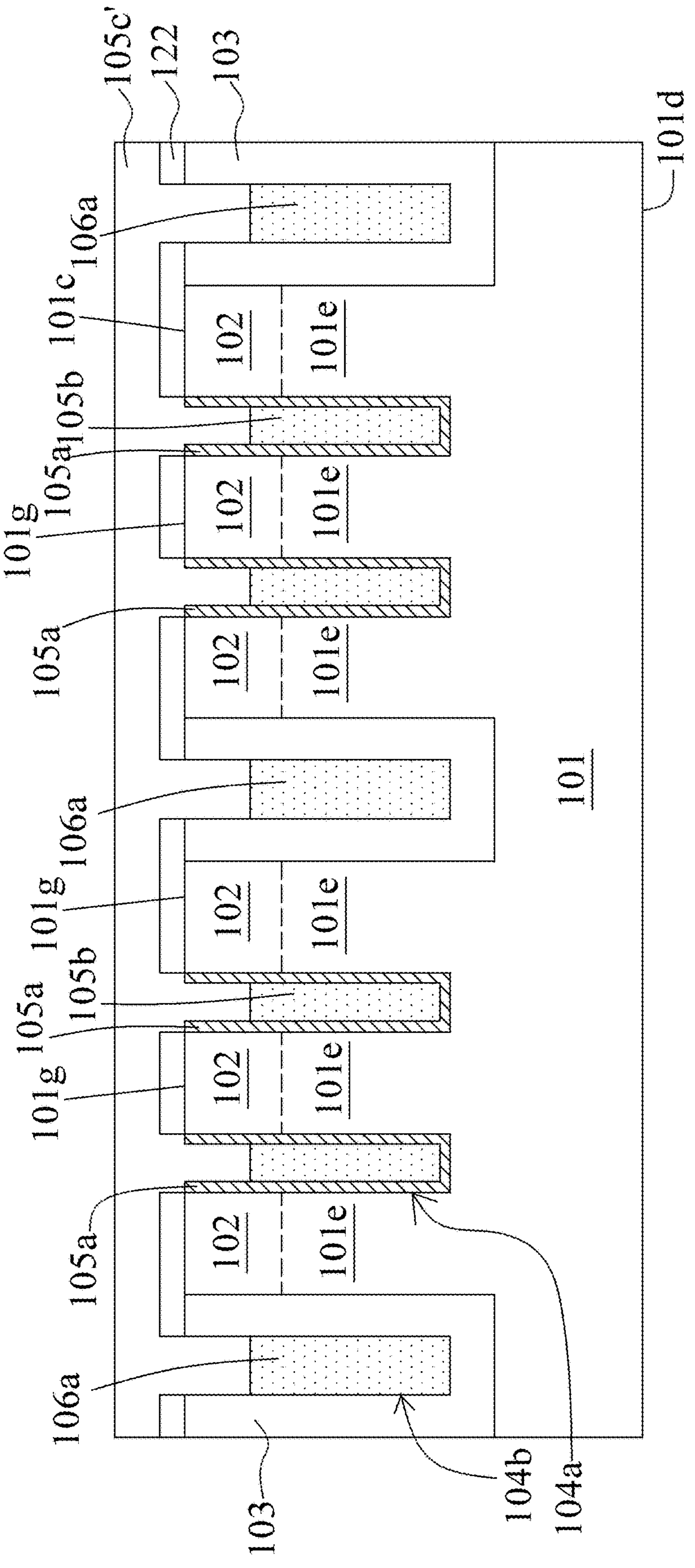
Figure 18:
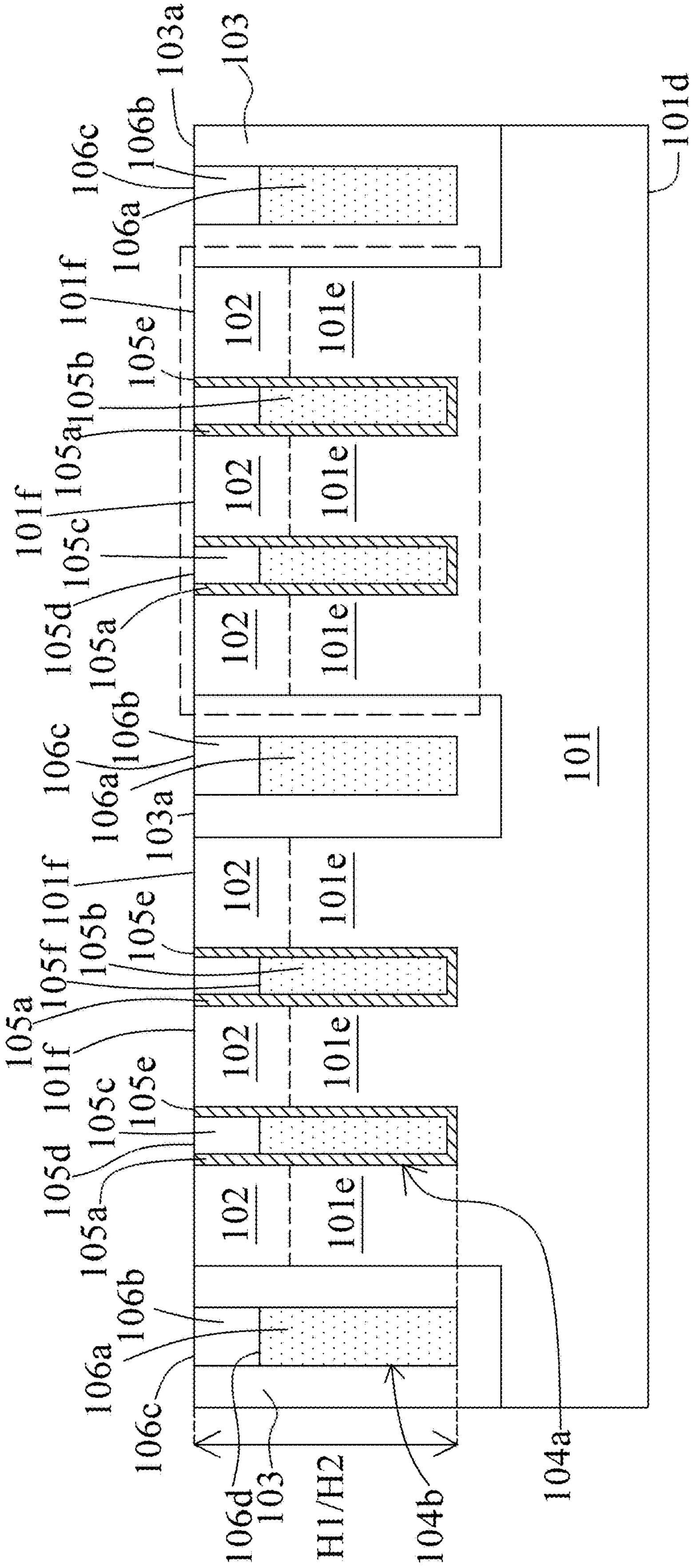

Referring to FIGS. 17 and 18, a third dielectric layer 105*c* is formed over the first conductive member 105*b* and surrounded by the second dielectric layer 105*a* in accordance with step S206 in FIG. 4. In some embodiments, the third dielectric layer 105*c* is formed over the first conductive member 105*b* and at least partially within the first recess 104*a*. In some embodiments, the third dielectric layer 105*c* is a nitride layer. In some embodiments, the formation of the third dielectric layer 105*c* includes disposing a dielectric material 105*c*' within the first recess 104*a* and over the first dielectric layer 122 and the first conductive member 105*b* as shown in FIG. 17, and then removing portions of the dielectric material 105*c*' that are outside of the first recess 104*a* as shown in FIG. 18. In some embodiments, the dielectric material 105*c*' is disposed by deposition or any other suitable process. In some embodiments, the portions of the dielectric material 105*c*' are removed by planarization, chemical mechanical polishing (CMP) or any other suitable process.

In some embodiments, a fourth dielectric layer 106*b* is formed over the second conductive member 106*a* and at least partially within the second recess 104*b*. In some embodiments, the fourth dielectric layer 106*b* is a nitride layer. In some embodiments, the formation of the fourth dielectric layer 106*b* includes disposing the dielectric material 105*c*' within the second recess 104*b* and over the first dielectric layer 122 and the second conductive member 106*a* as shown in FIG. 17, and then removing portions of the dielectric material 105*c*' that are outside of the second recess 104*b* as shown in FIG. 18. In some embodiments, the third dielectric layer 105*c* and the fourth dielectric layer 106*b* are formed simultaneously.

Figure 19:
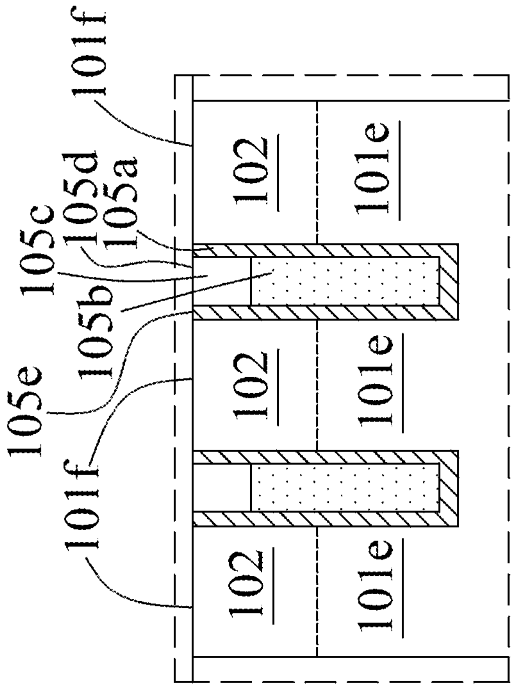

Referring to FIGS. 18 and 19, a portion of the second dielectric layer 105*a*, the first dielectric layer 122 and the rounded top surfaces 101*g* of the fins 101*e* are removed in accordance with step S207 in FIG. 4. In some embodiments, planar top surfaces 101*f* of the fins 101*e* are formed as shown in FIG. 19 after the removal of the rounded top surfaces 101*g* of the fins. In some embodiments, the planar top surface 101*f* of the fin 101*e* is substantially lower than the rounded top surface 101*g* of the fin 101*e*. In some embodiments, the height H1 of the fin 101*e* is reduced after the removal of the rounded top surface 101*g* of the fin 101*e*. In some embodiments, a length of the rounded top surface 101*g* is greater than a length of the planar top surface 101*f*.

In some embodiments, the rounded top surfaces 101*g* and the portions of the dielectric material 105*c*' (as shown in FIG. 17) are removed simultaneously, such that the planar top surfaces 101*f* and the third dielectric layer 105*c* are formed simultaneously. In some embodiments, the removal of the first dielectric layer 122, the portion of the second dielectric layer 105*a*, and the rounded top surfaces 101*g* of the fins 101*e* includes planarization or CMP.

In some embodiments, a second top surface 105*d* is also formed after the formation of the third dielectric layer 105*c*. In some embodiments, the second top surface 105*d* is planar and is substantially coplanar with the planar top surface 101*f* of the fin 101*e*. In some embodiments, a third top surface 105*e* is formed after the removal of the portion of the second dielectric layer 105*a*. In some embodiments, the third top surface 105*e* is planar and is substantially coplanar with the planar top surface 101*f* of the fin 101*e* and the second top surface 105*d*.

In some embodiments, a portion of the isolation 103 is also removed to form a fourth top surface 103*a* as shown in FIG. 18. In some embodiments, the removal of the portion of the isolation 103 and the removal of the rounded top surface 101*g* are performed simultaneously. In some embodiments, the fourth top surface 103*a* is a planar surface and is substantially coplanar with the planar top surface 101*f* of the fin 101*e*, the second top surface 105*d* and the third top surface 105*e*.

In some embodiments, a fifth top surface 106*c* is formed after the formation of the fourth dielectric layer 106*b*. In some embodiments, the removal of the portion of the isolation 103 and the formation of the fourth dielectric layer 106*b* are performed simultaneously. In some embodiments, the fifth top surface 106*c* is a planar surface and is substantially coplanar with the planar top surface 101*f* of the fin 101*e*, the second top surface 105*d*, the third top surface 105*e*, and the fourth top surface 103*a*. In some embodiments, a first interface 105*f* between the first conductive member 105*b* and the third dielectric layer 105*c* is substantially coplanar with a second interface 106*d* between the second conductive member 106*a* and the fourth dielectric layer 106*b*.

Figure 20:
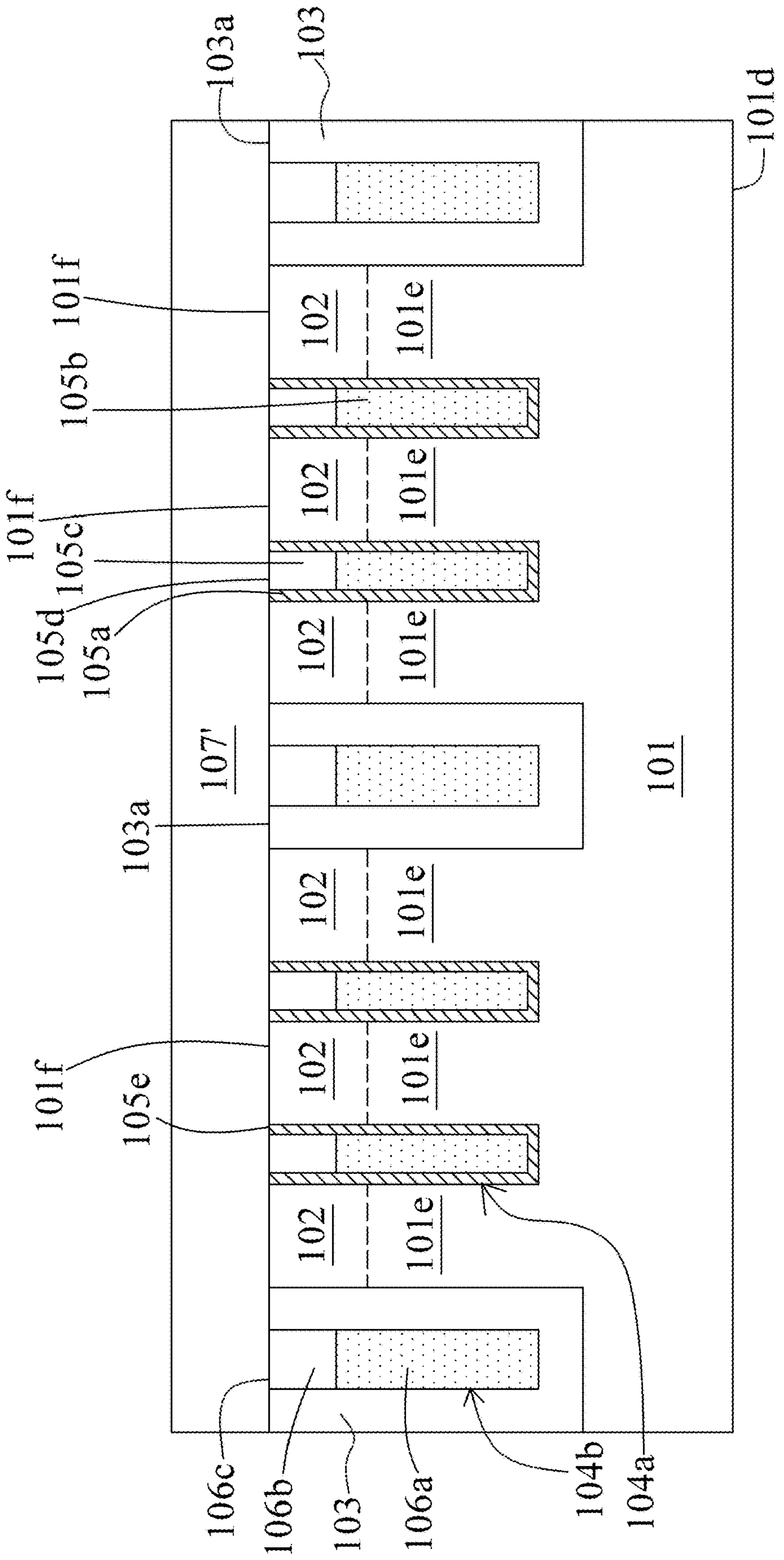
Figure 21:
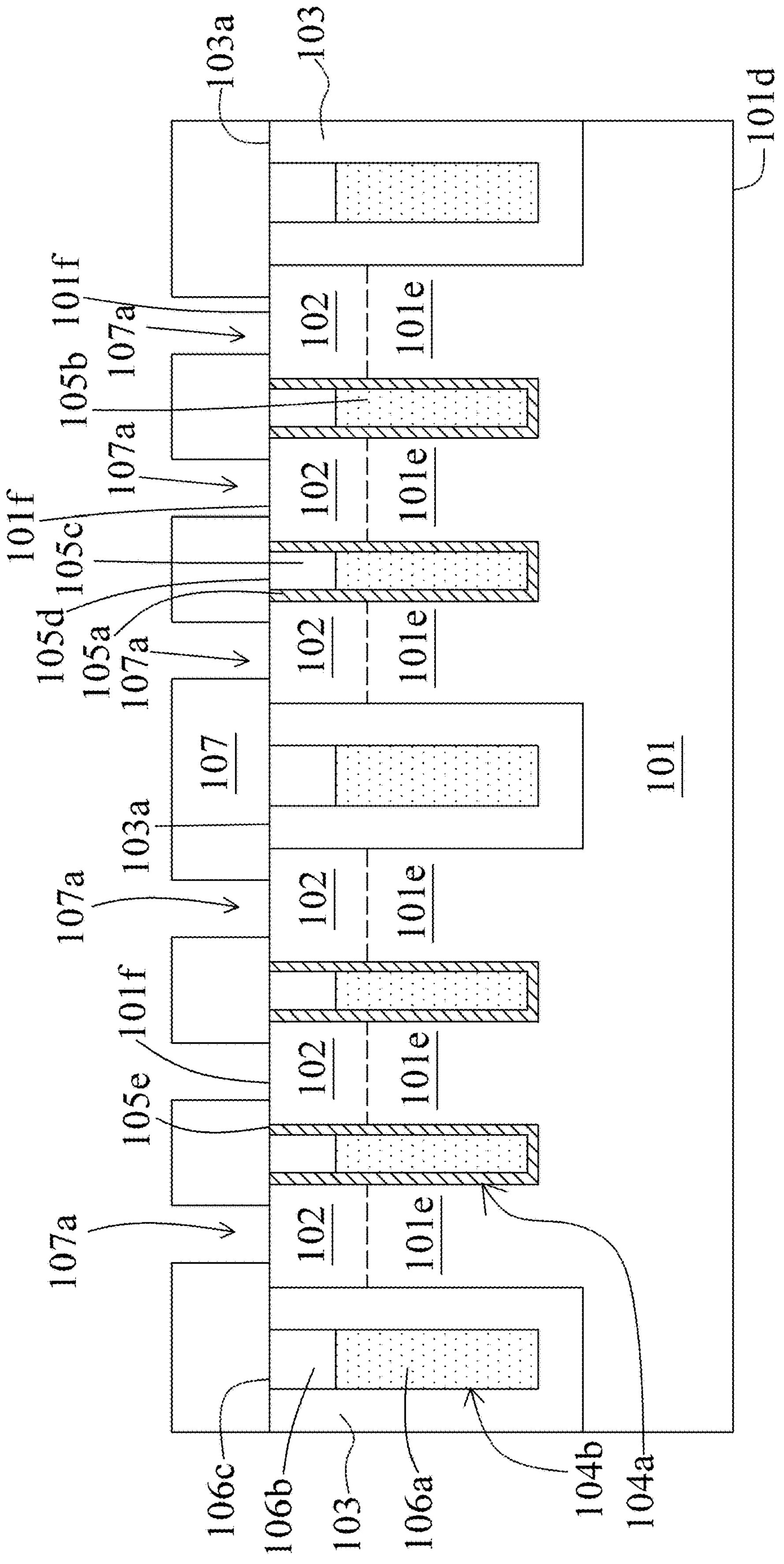
Figure 22:
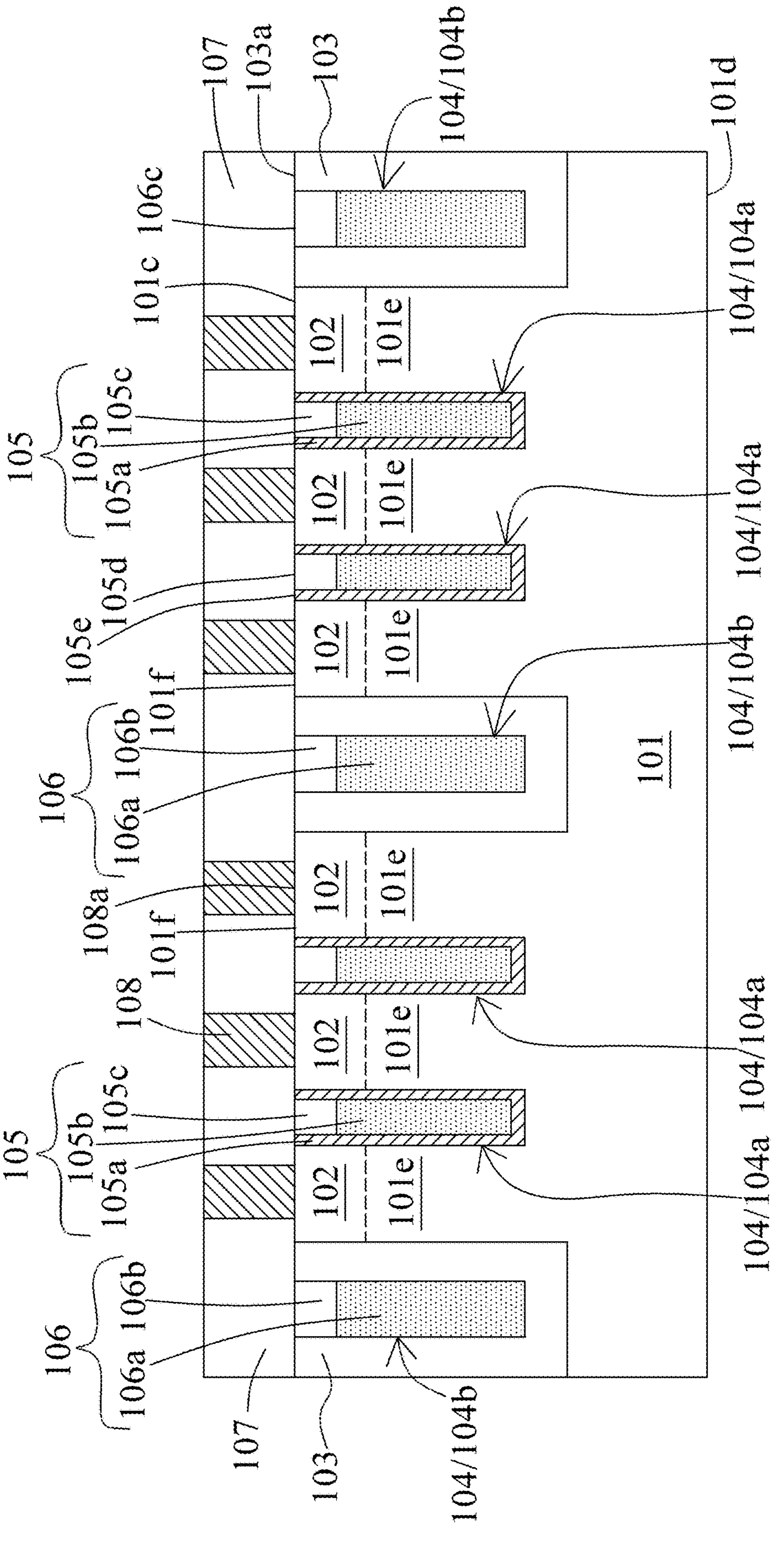

Referring to FIGS. 20, 21 and 22, after the formation of the planar top surface 101*f*, a first insulating layer 107 is formed over the semiconductor substrate 101 and a conductive plug 108 is formed in the first insulating layer 107 in accordance with step S208 in FIG. 4. In some embodiments, the conductive plug 108 extends through the first insulating layer 107. In some embodiments, the first insulating layer 107 is formed by disposing an insulating material 107' over the fins 101*e*, the isolations 103, the second dielectric layer 105*a*, the third dielectric layer 105*c* and the fourth dielectric layer 106*b*, as shown in FIG. 20, and then removing portions of the insulating material 107' to form several third recesses 107*a* extending through the first insulating layer 107 as shown in FIG. 21. In some embodiments, at least a portion of the planar top surface 101*f* of the fin 101*e* is exposed through the first insulating layer 107. In some embodiments, the insulating material 107' includes insulating material such as oxide, nitride or the like.

Referring to FIG. 22, after the formation of the first insulating layer 107, the conductive plug 108 is formed. In some embodiments, the conductive plug 108 extends through the first insulating layer 107 and contacts the planar top surface 101*f* of the fin 101*e*. In some embodiments, the conductive plug 108 is formed by disposing a conductive material into the third recess 107*a*. In some embodiments, the conductive material includes copper, silver or the like. In some embodiments, the conductive material is disposed by deposition, electroplating or any other suitable process. In some embodiments, a planar interface 108*a* between the conductive plug 108 and the planar top surface 101*f* of the fin 101*e* is formed. As a result, the memory device 100 including the array area 101*b*, as shown in FIG. 3, can be formed. In some embodiments, a cell capacitor is disposed above and electrically connected to the conductive plug 108.

Referring to FIG. 4 and FIGS. 23 to 26, in accordance with some embodiments of the present disclosure, in step S209, the formation of the memory device 100 may further comprise forming a second insulating layer 807, a capacitor plug 411, a barrier layer 412, and a landing pad 810. As a result, the memory device 100 including the array area 101*b* as shown in FIG. 3A can be formed. In some embodiments, a cell capacitor is disposed above and electrically connected to the landing pad 810.

Figure 23:
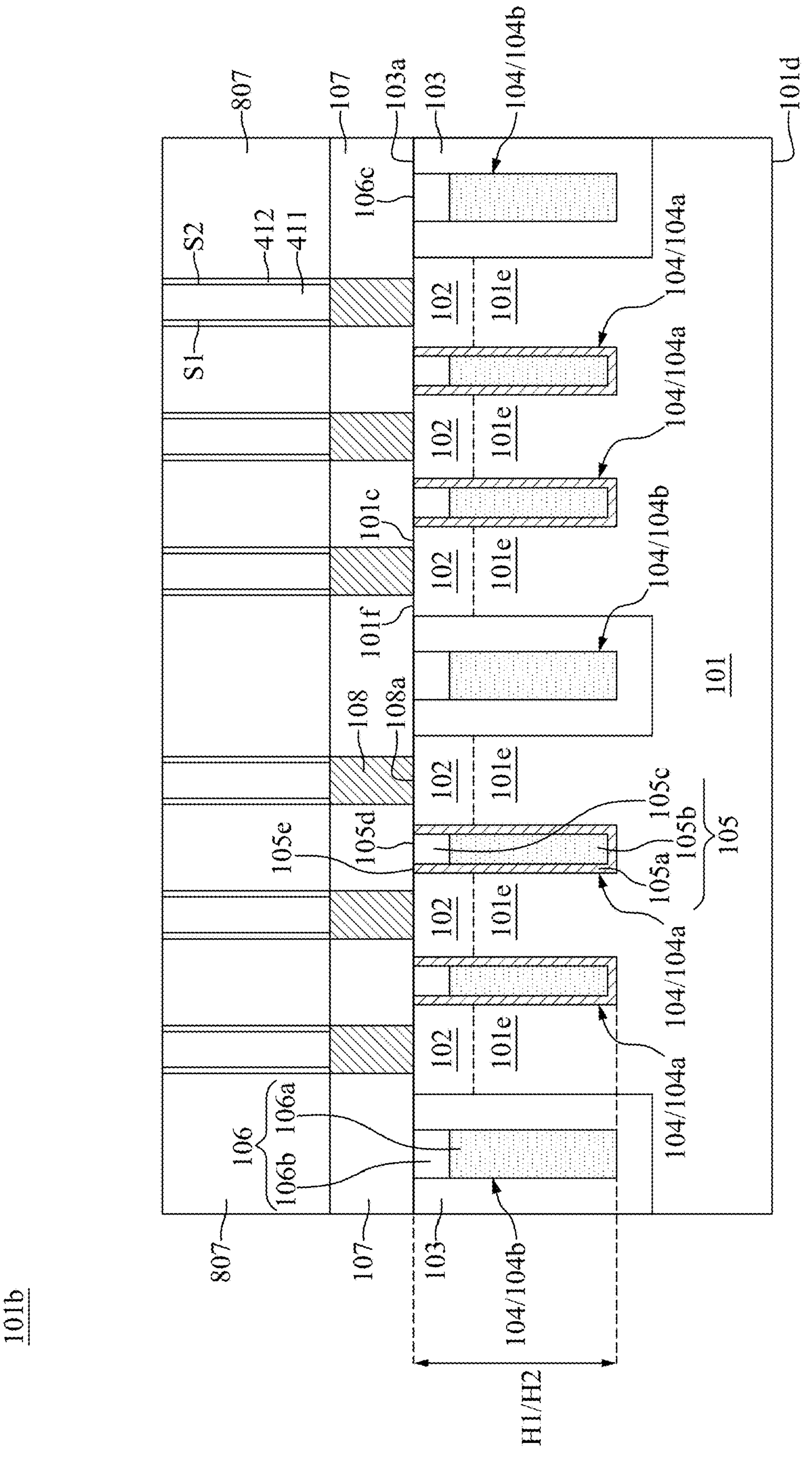

Referring to FIG. 23, a second insulating layer 807 is formed over the first insulating layer 107. In some embodiments, the second insulating layer 807 may be made of a material same as that of the first insulating layer 107, but is not limited thereto. In some embodiments, the second insulating layer 807 is formed by a process same as that of the first insulating layer 107.

Referring to FIG. 23, a capacitor plug 411 is formed in the second insulating layer 807 and over the conductive plug 108. In some embodiments, the capacitor plug 411 is formed by processes comprising: performing a photolithography process to define a position of the capacitor plug 411; performing an etching process, such as an anisotropic dry etching process, to form a capacitor plug opening (not shown) extending through the second insulating layer 807; depositing a conductive material over the second insulating layer 807 and in the capacitor plug opening; performing a metallization process in the capacitor plug opening to form the capacitor plug 411 over the conductive plug 108; and performing a planarization process, such as chemical mechanical polishing, to remove excess deposited material, thus providing a substantially flat surface for subsequent processing steps. In some embodiments, the conductive material comprises aluminum, copper, tungsten, cobalt, or another suitable metal or metal alloy. In some embodiments, the metallization process is a chemical vapor deposition, a physical vapor deposition, or a sputtering.

Referring to FIG. 23, a barrier layer 412 is disposed between the capacitor plug 411 and the second insulating layer 807. In some embodiments, the barrier layer 412 is disposed on and attached to sidewalls of the capacitor plug 411. In some embodiments, the barrier layer 412 is made of titanium (Ti), titanium nitride (TiN), or a combination thereof.

Figure 24:
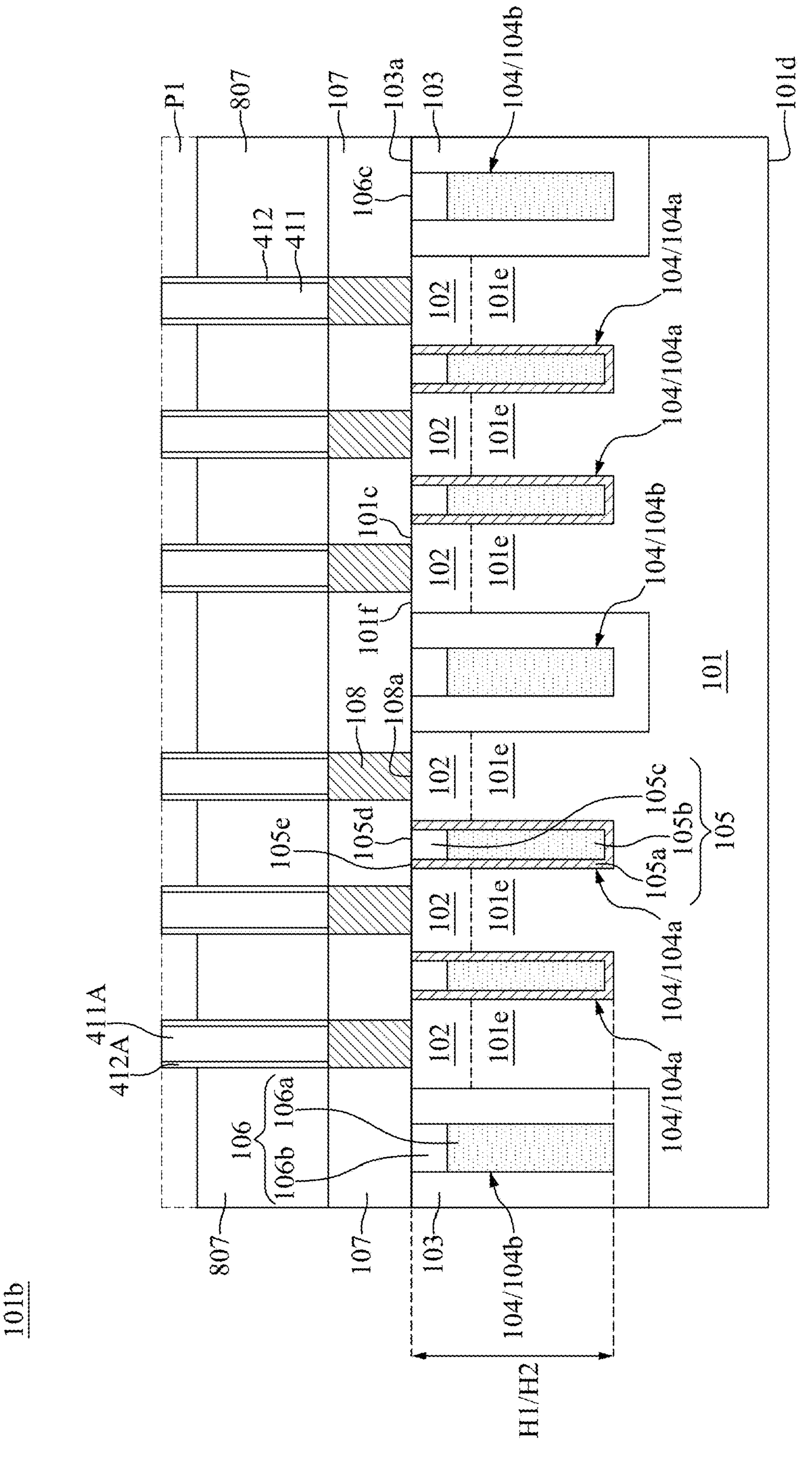

Referring to FIG. 24, an etching process is performed to remove a portion P1 of the second insulating layer 807 to expose a protruding portion 411A of the capacitor plug 411. In some embodiments, an etch-back process is performed to remove a top portion of the second insulating layer 807 to expose the protruding portion 411A of the capacitor plug 411 and a top portion 412A of the barrier layer 412. In some embodiments, after the etch-back process, a top surface of capacitor plug 411 is higher than a top surface of the second insulating layer 807, and a sidewall of the top portion 412A is exposed.

Figure 25:
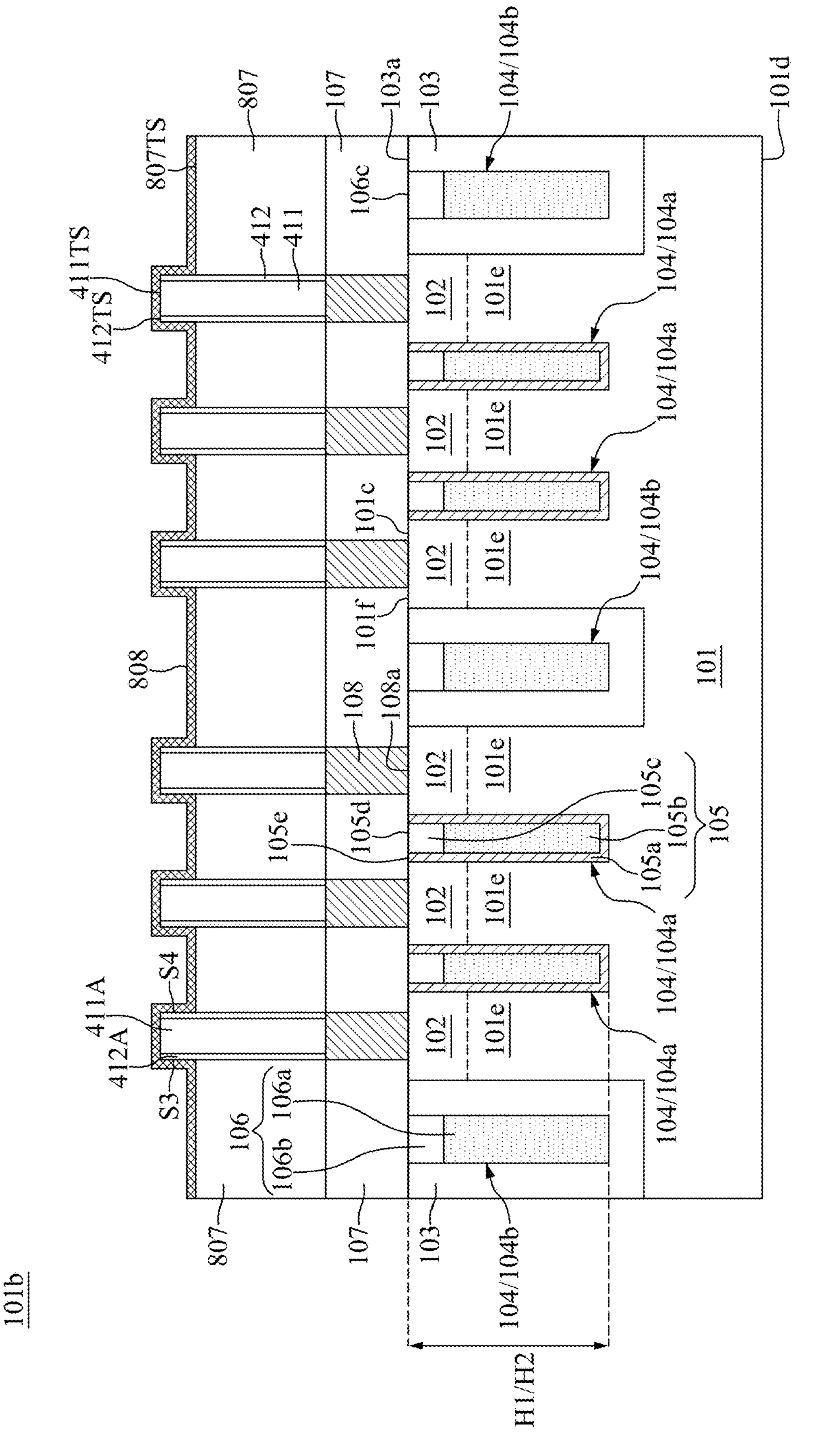

Referring to FIG. 25, a deposition process is performed to form a liner layer 808 covering the top surface of the second insulating layer 807, a top surface of the protruding portion 411A, and the sidewalls of the top portion 412A. In some embodiments, the liner layer 808 is a silicon-containing layer, such as a polysilicon layer.

Figure 26:
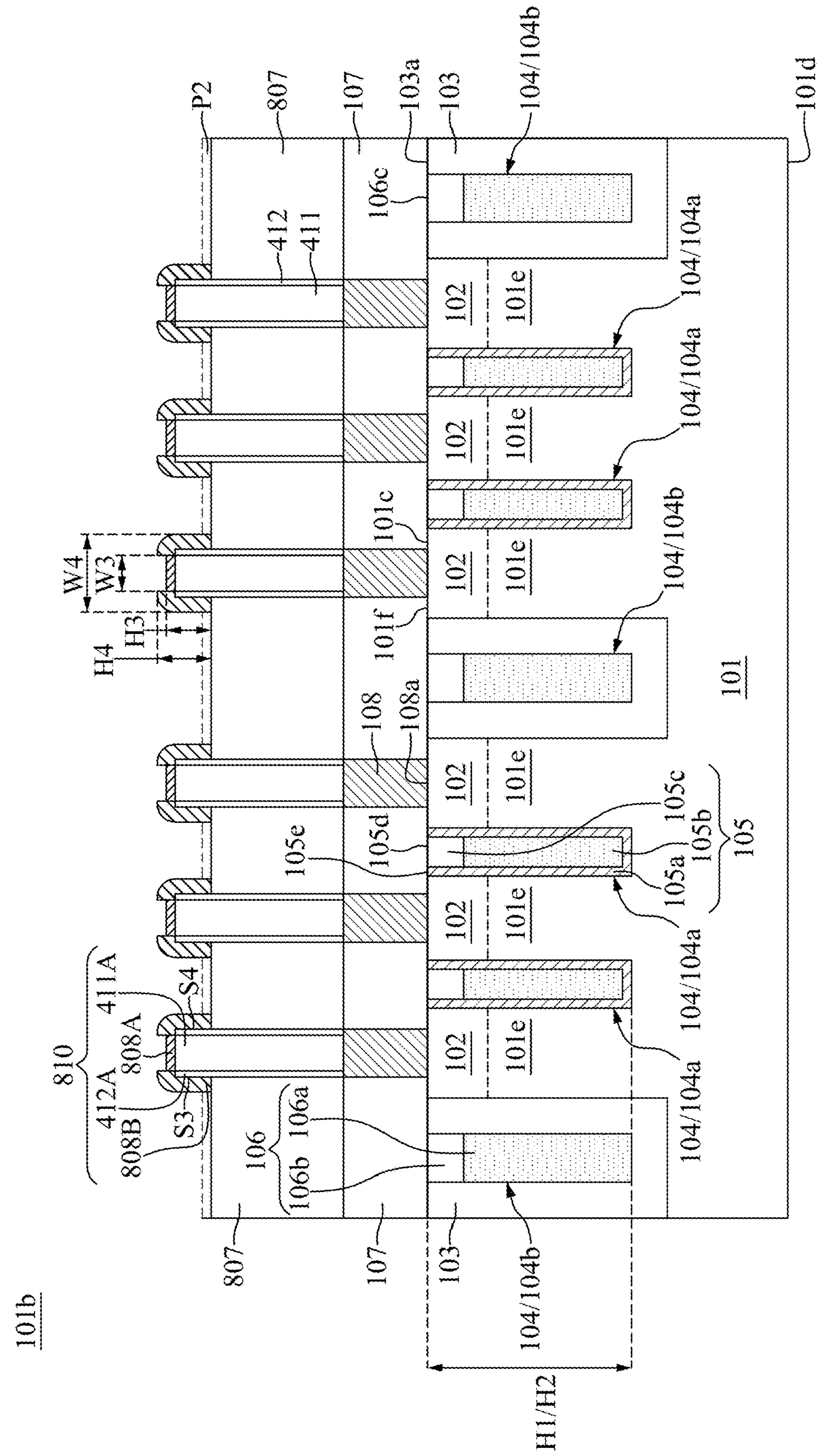

Referring to FIG. 26, a thermal process is performed to form the landing pad 810 over the second insulating layer 807. In some embodiments, a silicide process (thermal process) is performed to form the landing pad 810 over the second insulating layer 807, wherein the landing pad 810 comprises the protruding portion 411A of the capacitor plug 411, the top portion 412A of the barrier layer 412, a first silicide layer (metal silicide) 808A over the protruding portion 411A, and a second silicide layer (metal silicide) 808B on a sidewall of the protruding portion 411A. In some embodiments, the thermal process transforms a portion of the protruding portion 411A and the liner layer 808 into the first silicide layer 808A. In some embodiments, the thermal process transforms the top portion 412A of the barrier layer 412 and the liner layer 808 into the second silicide layer 808B. In other words, the landing pad 810 is formed without using the lithographic technique, i.e., the landing pad 810 is self-aligned to the capacitor plug 411. In some embodiments, a thickness and a shape of the protruding portion 411A and the top portion 412A may be changed (not shown in the drawings).

In addition, an etching process, such as an anisotropic dry etching process, is performed to remove a portion P2 of the liner layer 808 not transformed into the metal silicide by the thermal process. In some embodiments, the silicide process between the top portion 412A and the liner layer 808 proceeds more quickly than the silicide process between the protruding portion 411A and the liner layer 808, and the top end of the second silicide layer 808B is higher than the top end of the first silicide layer 808A. In other words, since a height H4 of the second silicide layer 808B is greater than a height H3 of the first silicide layer 808A, a step structure is formed between the first silicide layer 808A and the second silicide layer 808B. In some embodiments, the second silicide layer 808B surrounds the first silicide layer 808A, and a width W4 of the second silicide layer 808B is greater than a width W3 of the first silicide layer 808A.

Referring to FIG. 4 and FIGS. 27 to 29, in accordance with some embodiments of the present disclosure, in step S210, the formation of the memory device 100 may further comprise forming a patterned mask 133 over the second insulating layer 807, forming a fifth dielectric layer 151 over the patterned mask 133, and forming a metal plug 163 in the fifth dielectric layer 151 and on the capacitor plug 411. As a result, the memory device 100 including the array area 101*b* as shown in FIG. 3C can be formed. In some embodiments, a cell capacitor is disposed above and electrically connected to the metal plug 163.

Figure 27:
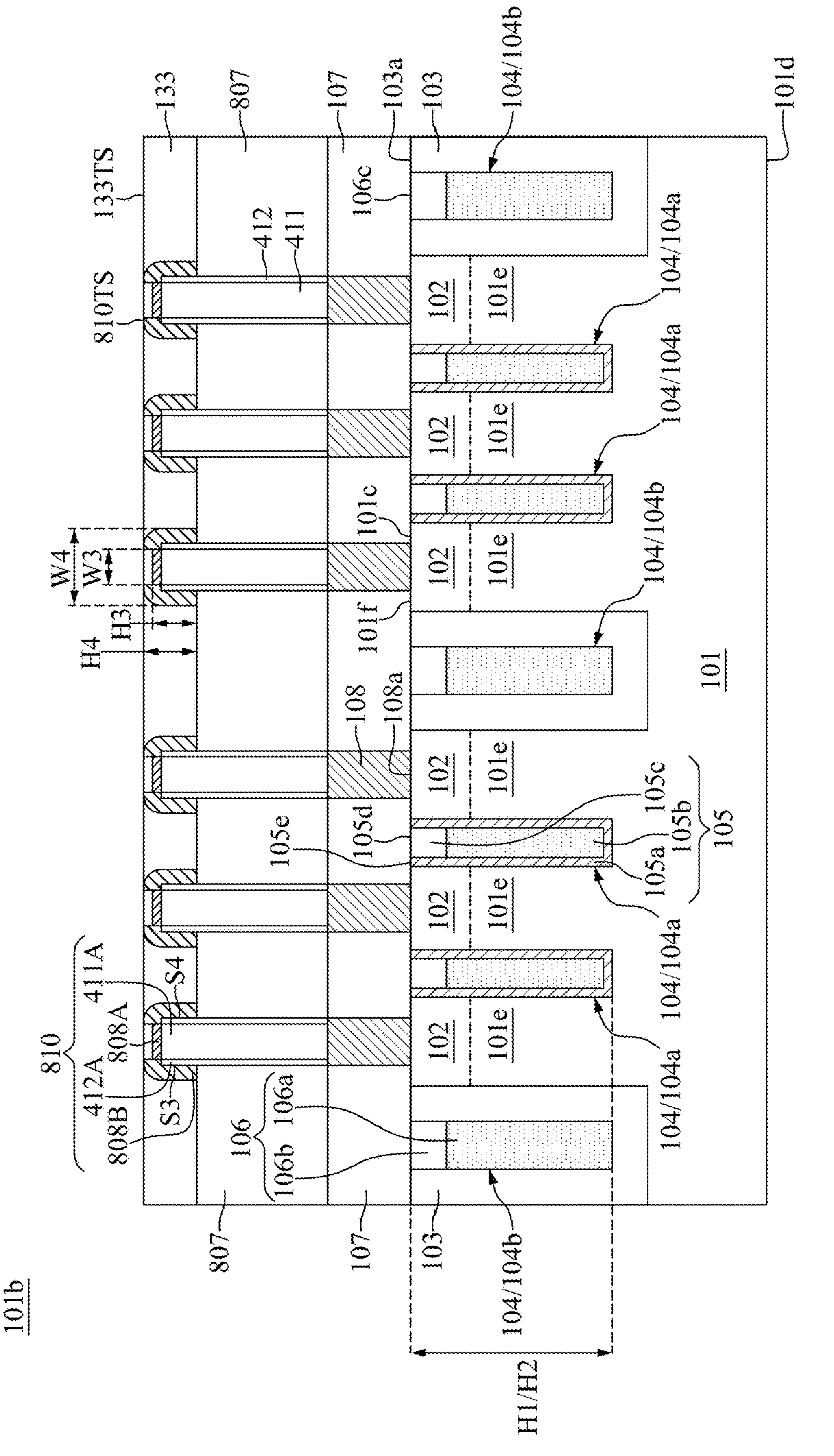

Referring to FIG. 27, the patterned mask 133 is disposed over the second insulating layer 807, and the landing pad 810 is disposed in the patterned mask 133. In some embodiments, a planarization process, such as a chemical mechanical polishing or an etching process, is performed to remove a portion of the patterned mask 133, thus providing a substantially flat surface for subsequent processing steps. The planarization process is performed until the second silicide layer 808B is exposed. In some embodiments, a top surface 810TS of the landing pad 810 (or a top surface of the second silicide layer 808B) and a top surface 133TS of the patterned mask 133 are substantially coplanar.

Figure 28:
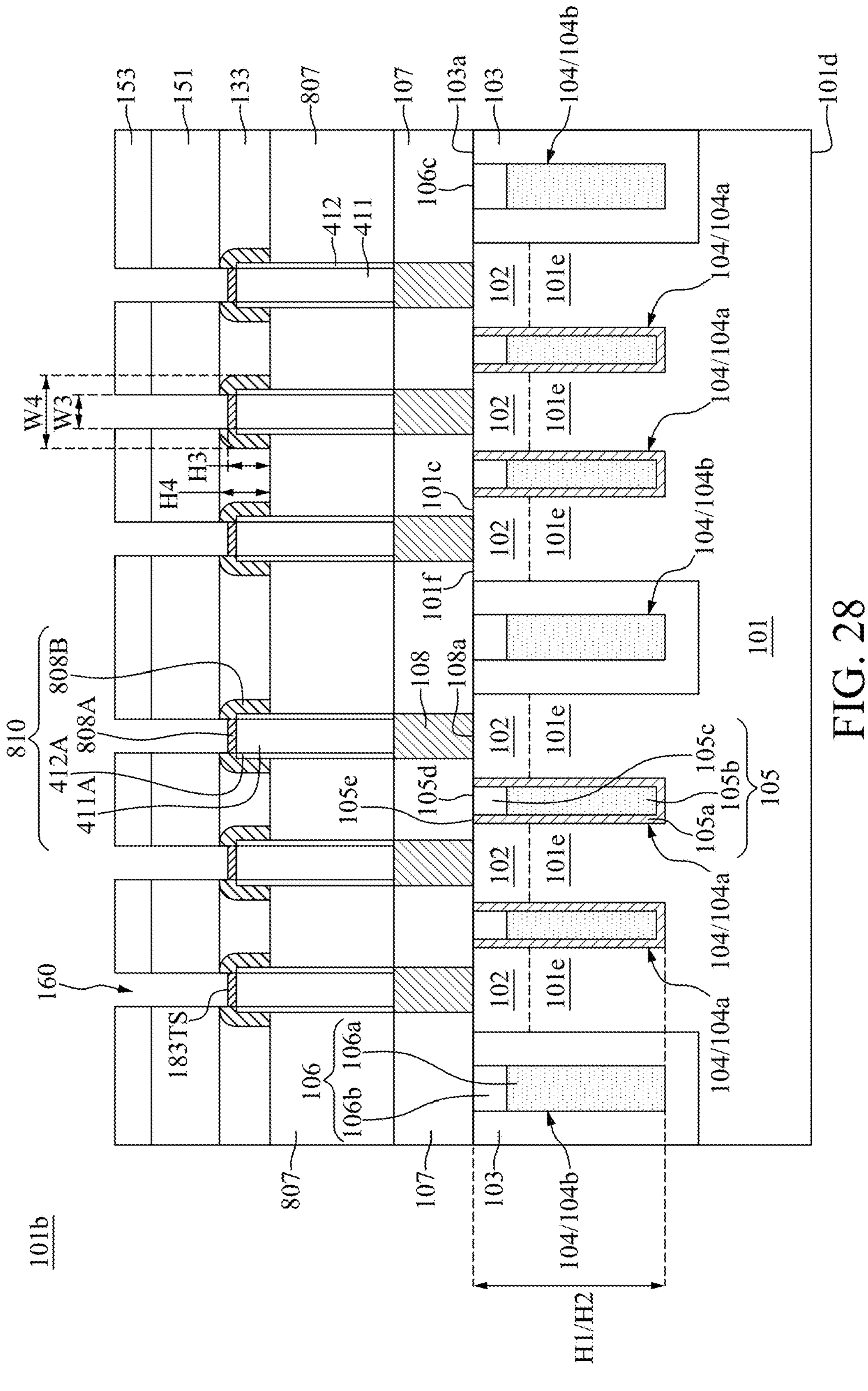

Referring to FIG. 28, the fifth dielectric layer 151 is formed over the patterned mask 133, and another patterned mask 153 is formed over the fifth dielectric layer 151. In some embodiments, the fifth dielectric layer 151 is etched using the patterned mask 153 as a mask, such that an opening 160 is formed penetrating through the fifth dielectric layer 151.

In some embodiments, the portion of the patterned mask 133 over the first silicide layer 808A is removed, such that a top surface 813TS of the first silicide layer 808A is exposed by the opening 160. Moreover, the second silicide layer 808B may be slightly etched during the etching process for forming the opening 160. The opening 160 may be formed by a wet etching process, a dry etching process, or a combination thereof. After the opening 160 is formed, the patterned mask 153 may be removed.

Figure 29:
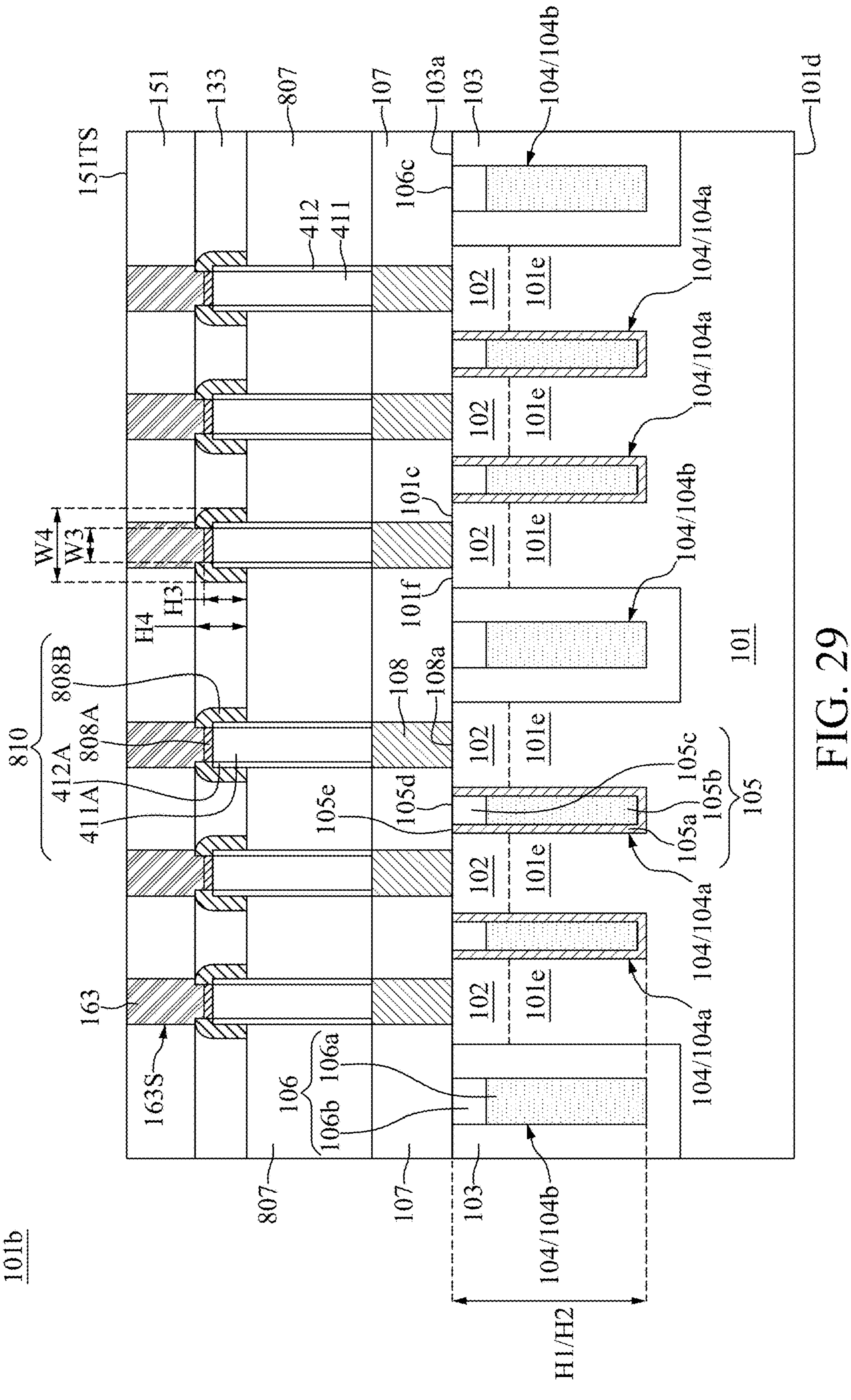

Referring to FIG. 29, the metal plug 163 is formed in the opening 160 (see FIG. 28) to directly contact the second silicide layer 808B and the first silicide layer 808A. In some embodiments, the metal plug 163 is made of tungsten (W), aluminum (Al), copper (Cu), titanium (Ti), tantalum (Ta), a combination thereof, or another applicable metal material. The formation of the metal plug 163 may include a deposition process and a planarization process. The deposition process may be a CVD process, a PVD process, an ALD process, a MOCVD process, a sputtering process, a plating process, or another applicable process. The planarization process may include a CMP process.

One aspect of the present disclosure provides a memory device. The memory device includes a semiconductor substrate defined with an active area and including a plurality of fins protruding from the semiconductor substrate and disposed within the active area, wherein each of the plurality of fins has a first planar top surface; a first word line extending into the semiconductor substrate and between an adjacent pair of the plurality of fins, wherein the first word line includes an oxide layer conformal to surfaces of the adjacent pair of the plurality of fins, a first conductive member surrounded by the oxide layer, and a first nitride layer disposed over the first conductive member and surrounded by the oxide layer, wherein the first nitride layer has a second planar top surface substantially coplanar with the first planar top surface of each of the plurality of fins; an isolation extending into the semiconductor substrate and surrounding the active area; a second word line disposed within the isolation and separated from the first word line by the plurality of fins; a conductive plug disposed over each of the plurality of fins and surrounded by a first insulating layer, wherein the first insulating layer is disposed over the semiconductor substrate and the isolation; a capacitor plug disposed in a second insulating layer and over the conductive plug, and disposed protruding from the second insulating layer; and a landing pad disposed over the second insulating layer and over the capacitor plug.

Another aspect of the present disclosure provides a memory device. The memory device includes a semiconductor substrate defined with an active area; a plurality of fins disposed in the active area of the semiconductor substrate and protruding from the semiconductor substrate, wherein each of the plurality of fins has a first planar top surface; a word line structure, comprising a first word line extending into the semiconductor substrate and between an adjacent pair of the plurality of fins, wherein the first word line includes an oxide layer conformal to surfaces of the adjacent pair of the plurality of fins, a first conductive member surrounded by the oxide layer, and a first nitride layer disposed over the first conductive member and surrounded by the oxide layer, wherein the first nitride layer has a second planar top surface substantially coplanar with the first planar top surface of each of the plurality of fins; an isolation extending into the semiconductor substrate and surrounding the active area; a second word line disposed within the isolation and separated from the first word line by the plurality of fins; a conductive plug disposed over each of the plurality of fins and surrounded by a first insulating layer, wherein the first insulating layer is disposed over the semiconductor substrate and the isolation; a capacitor plug disposed in a second insulating layer and over the conductive plug, and disposed protruding from the second insulating layer; a landing pad disposed over the second insulating layer and over the capacitor plug; a patterned mask disposed over the second insulating layer and surrounding the landing pad; and a metal plug disposed on the landing pad.

Another aspect of the present disclosure provides a method for manufacturing a memory device. The method includes providing a first semiconductor structure, wherein the first semiconductor structure comprises a semiconductor substrate defined with a plurality of active areas; an isolation surrounding each of the plurality of active areas; a plurality of first recesses and a plurality of second recesses in the semiconductor substrate; a plurality of fins protruding from the semiconductor substrate, wherein each of the fins has a planar surface; a first dielectric layer conformal to each of the plurality of first recesses and surrounding the plurality of fins, wherein each of the plurality of fins has a first top surface after the formation of the first dielectric layer; a first conductive member within each of the plurality of first recesses and surrounded by the first dielectric layer; a second dielectric layer over the first conductive member and surrounded by the first dielectric layer; a conductive plug disposed over each of the plurality of fins and surrounded by a first insulating layer, wherein the first insulating layer is disposed over the semiconductor substrate and the isolation, and the conductive plug extends through the first insulating layer, wherein each of the plurality of fins has a planar top surface; forming an insulating layer over the first semiconductor structure; forming a capacitor plug in the insulating layer; forming a barrier layer on and attached to sidewalls of the capacitor plug; and forming a landing pad over the insulating layer and disposed on the capacitor plug.

In conclusion, because a top portion of each of fins protruding from a substrate is planarized prior to a formation of a contact between a cell capacitor and one of the fins, a contact area between the cell capacitor and the fin is increased by the planarization of the top portion, so that a curved surface of the top portion becomes a planar surface. Therefore, an overall performance of a memory device and a process of manufacturing the memory device are improved.

Although the present disclosure and its advantages have been described in detail, it should be understood that various changes, substitutions and alterations can be made herein without departing from the spirit and scope of the disclosure as defined by the appended claims.

For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A memory device comprising:
- a semiconductor substrate defined with an active area;
- a plurality of fins disposed in the active area of the semiconductor substrate and protruding from the semiconductor substrate, wherein each of the plurality of fins has a first planar top surface;
- a word line structure, comprising:
  - a first word line extending into the semiconductor substrate and between an adjacent pair of the plurality of fins, wherein the first word line includes an oxide layer conformal to surfaces of the adjacent pair of the plurality of fins, a first conductive member surrounded by the oxide layer, and a first nitride layer disposed over the first conductive member and surrounded by the oxide layer, wherein the first nitride layer has a second planar top surface substantially coplanar with the first planar top surface of each of the plurality of fins;
  - an isolation extending into the semiconductor substrate and surrounding the active area; and
  - a second word line disposed within the isolation and separated from the first word line by the plurality of fins;
- a conductive plug disposed over each of the plurality of fins and surrounded by a first insulating layer, wherein the first insulating layer is disposed over the semiconductor substrate and the isolation; a capacitor plug disposed in a second insulating layer and over the conductive plug, and disposed protruding from the second insulating layer;
- a landing pad disposed over the second insulating layer and over the capacitor plug;
- a patterned mask disposed over the second insulating layer and surrounding the landing pad; and
- a metal plug disposed on the landing pad.

2. The memory device of claim 1, wherein the oxide layer has a third planar top surface substantially coplanar with the first planar top surface of each of the plurality of fins and the second planar top surface of the first nitride layer.

3. The memory device of claim 2, wherein the third planar top surface of the oxide layer is coupled with the first planar top surface of one of the plurality of fins and the second planar top surface of the first nitride layer.

4. The memory device of claim 3, wherein the isolation has a fourth planar top surface substantially coplanar with the first planar top surface of each of the plurality of fins.

5. The memory device of claim 1, wherein the conductive member includes tungsten.

6. The memory device of claim 1, wherein a height of the second word line is substantially greater than a height of the first word line.

7. The memory device of claim 1, wherein the conductive plug extends through the first insulating layer.

8. The memory device of claim 7, wherein the conductive plug is formed of copper, silver or the like.

9. The memory device of claim 8, wherein the conductive plug is configured to electrically connect to a capacitor plug disposed above the first insulating layer.

10. The memory device of claim 9, wherein the first insulating layer is formed of silicon oxide, silicon nitride, silicon oxynitride, the like, or a combination thereof.

11. The memory device of claim 1, wherein the capacitor plug comprises a protruding portion protruding from the second insulating layer.

12. The memory device of claim 11, wherein the capacitor plug is made of aluminum, copper, tungsten, cobalt, or another suitable metal or metal alloy.

13. The memory device of claim 12, wherein the second insulating layer is formed of a material same as that of the first insulating layer.

14. The memory device of claim 13, further comprising a barrier layer disposed between the capacitor plug and the second insulating layer, and disposed on and attached to sidewalls of the capacitor plug.

15. The memory device of claim 14, wherein the barrier layer is made of titanium (Ti), titanium nitride (TiN), or a combination thereof.

16. The memory device of claim 15, wherein the barrier layer comprises a top portion protruding from the second insulating layer, wherein the top portion has sidewalls protruding from a top surface of the second insulating layer.

17. The memory device of claim 16, wherein the landing pad comprises a protruding portion of the capacitor plug, the top portion of the barrier layer, a first silicide layer over the protruding portion, and a second silicide layer on the sidewalls of the top portion of the barrier layer, wherein the second silicide layer is in direct contact with the sidewalls of the top portion of the barrier layer and the top surface of the second insulating layer.

18. The memory device of claim 17, wherein a thermal process is performed to form the landing pad.

19. The memory device of claim 18, wherein materials of the first silicide layer and the second silicide layer are different.

20. The memory device of claim 19, wherein the patterned mask is disposed over the second insulating layer.

* * * * *